US012414342B2

(12) United States Patent
Agata et al.

(10) Patent No.: US 12,414,342 B2
(45) Date of Patent: Sep. 9, 2025

(54) SEMICONDUCTOR DEVICE

(71) Applicant: FUJI ELECTRIC CO., LTD., Kanagawa (JP)

(72) Inventors: Yasunori Agata, Matsumoto (JP); Tohru Shirakawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 526 days.

(21) Appl. No.: 17/844,052

(22) Filed: Jun. 20, 2022

(65) Prior Publication Data

US 2022/0320288 A1  Oct. 6, 2022

Related U.S. Application Data

(63) Continuation of application No. PCT/JP2021/026375, filed on Jul. 13, 2021.

(30) Foreign Application Priority Data

Jul. 15, 2020 (JP) ................ 2020-121285

(51) Int. Cl.
*H10D 62/13* (2025.01)
*H10D 12/00* (2025.01)
(Continued)

(52) U.S. Cl.
CPC ......... *H10D 62/137* (2025.01); *H10D 12/481* (2025.01); *H10D 62/112* (2025.01); *H10D 62/142* (2025.01); *H10D 62/393* (2025.01)

(58) Field of Classification Search
CPC . H01L 29/06; H01L 29/08; H01L 29/36–365; H01L 21/823493;
(Continued)

(56) References Cited

U.S. PATENT DOCUMENTS 6,777,747 B2 * 8/2004 Yedinak .............. H01L 29/7397
257/E29.198
9,466,689 B2 * 10/2016 Miyazaki .......... H01L 29/66348
(Continued)

FOREIGN PATENT DOCUMENTS

JP   H11274484 A   10/1999
JP   2002261282 A   9/2002
(Continued)

OTHER PUBLICATIONS (ISA/237) Written Opinion of the International Search Authority for International Patent Application No. PCT/JP2021/026375, issued/mailed by the Japan Patent Office on Sep. 21, 2021.

*Primary Examiner* — Jeff W Natalini
*Assistant Examiner* — Andrew John Zabel

(57) ABSTRACT

A semiconductor device, including, a drift region of a first conductivity type provided on a semiconductor substrate; a field stop region of a first conductivity type provided below the drift region and having one or more peaks; and a collector region of a second conductivity type provided below the field stop region, wherein when an integral concentration of the collector region is set to be x [cm$^{-2}$], a depth of a first peak that is a shallowest from the back surface of the semiconductor substrate out of the one or more peaks is set to be y1 [μm], line A1: y1=(−7.4699E−01)ln(x)+(2.7810E+01), and line B1: y1=(−4.7772E−01)ln(x)+(1.7960E+01), a depth of the first peak and the integral concentration are within a range between a line A1 and a line B1, is provided.

26 Claims, 29 Drawing Sheets

(51) Int. Cl.
  *H10D 62/10* (2025.01)
  *H10D 62/17* (2025.01)
(58) Field of Classification Search
  CPC .......... H01L 21/823885; H10D 62/137; H10D 62/142; H10D 62/112; H10D 62/393; H10D 12/481
  See application file for complete search history.

(56) References Cited

U.S. PATENT DOCUMENTS

| | | | |
|---|---|---|---|
| 10,170,497 B2 * | 1/2019 | Kautzsch | ................. H05K 3/30 |
| 10,468,254 B2 * | 11/2019 | Takishita | ............ H01L 29/7397 |
| 2002/0100934 A1 | 8/2002 | Nakagawa | |
| 2002/0117712 A1 | 8/2002 | Matsudai | |
| 2013/0037853 A1 | 2/2013 | Onozawa | |
| 2014/0070268 A1 | 3/2014 | Yoshimura | |
| 2015/0024556 A1 | 1/2015 | Miyazaki | |
| 2016/0372541 A1 | 12/2016 | Onozawa | |
| 2017/0025410 A1 | 1/2017 | Cheng | |
| 2017/0278929 A1 * | 9/2017 | Imagawa | ................. H01L 29/78 |
| 2017/0352730 A1 * | 12/2017 | Nakamura | ............ H01L 21/266 |
| 2018/0012762 A1 | 1/2018 | Mukai | |
| 2021/0043739 A1 | 2/2021 | Kato | |
| 2024/0290845 A1 * | 8/2024 | Agata | ................... H01L 29/739 |

FOREIGN PATENT DOCUMENTS

| | | |
|---|---|---|
| JP | 2002305305 A | 10/2002 |
| JP | 2002314083 A | 10/2002 |
| JP | 2005268487 A | 9/2005 |
| JP | 2015135954 A | 7/2015 |
| WO | 2011111500 A1 | 9/2011 |
| WO | 2012157772 A1 | 11/2012 |
| WO | 2013147275 A1 | 10/2013 |
| WO | 2016042954 A1 | 3/2016 |
| WO | 2016120999 A1 | 8/2016 |
| WO | 2017047285 A1 | 3/2017 |
| WO | 2020100995 A1 | 5/2020 |

\* cited by examiner

SEMICONDUCTOR DEVICE

The contents of the following Japanese patent application(s) are incorporated herein by reference:
NO. 2020-121285 filed in JP on Jul. 15, 2020, and
NO. PCT/JP2021/026375 filed in WO on Jul. 13, 2021.

BACKGROUND

1. Technical Field

The present invention relates to a semiconductor device.

2. Related Art

Conventionally, a semiconductor device including a field stop region is known (for example, see Patent Document 1).
Patent Document 1: Japanese Patent Application Publication No. 2015-135954

DESCRIPTION OF EXEMPLARY EMBODIMENTS

Figure 1A:
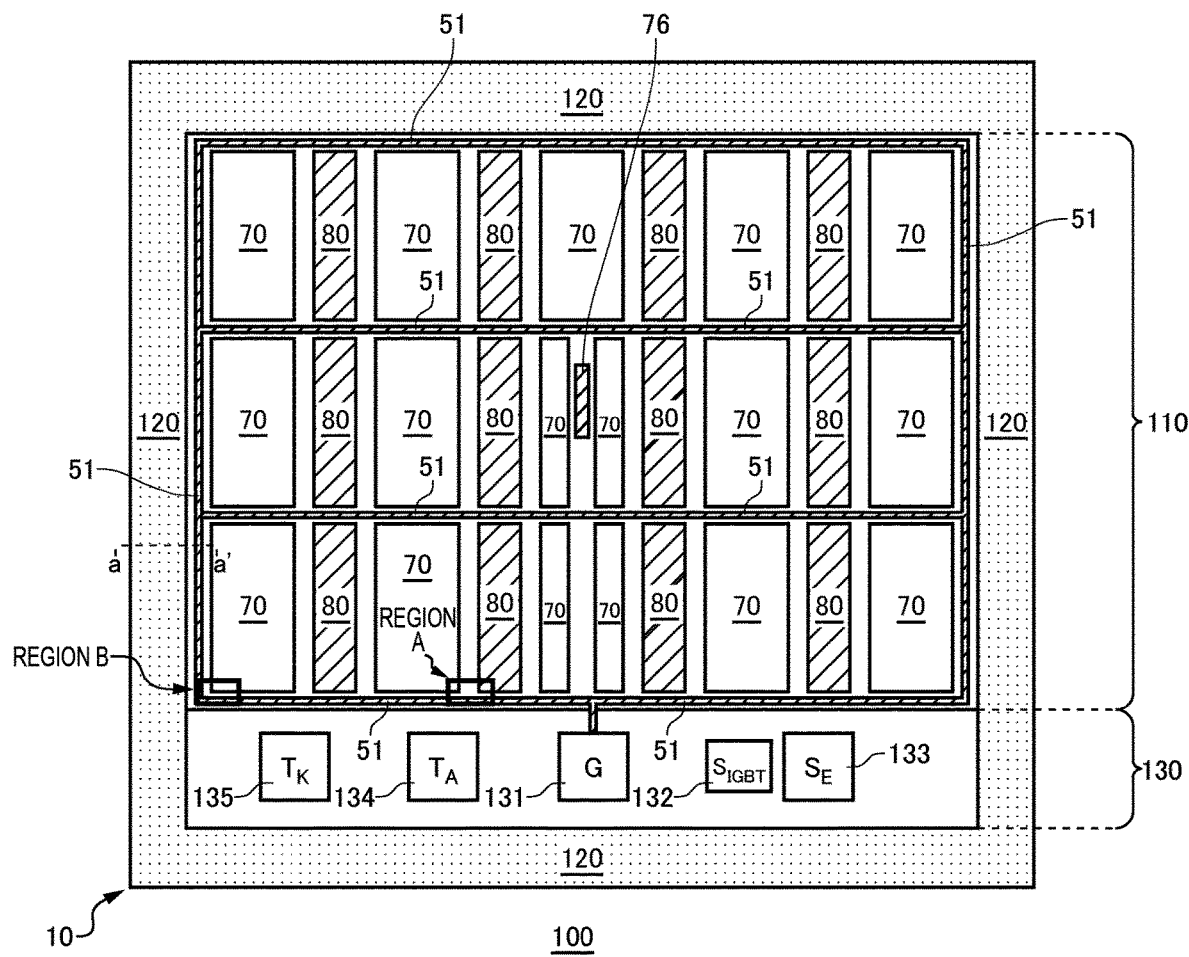
FIG. 1A is an example of a top view of a semiconductor device 100.

Hereinafter, the present invention will be described through embodiments of the invention, but the following embodiments do not limit the claimed invention. In addition, not all combinations of features described in the embodiments are essential to the solution of the invention.

In the present specification, one side in a direction parallel to the depth direction of a semiconductor substrate is referred to as an "upper" side, and the other side is referred to as a "lower" side. One surface of two principal surfaces of a substrate, a layer or other member is referred to as an upper surface, and the other surface is referred to as a lower surface. The "upper", "lower", "front", and "back" directions are not limited to the gravitational direction or the direction of attachment to a substrate or the like at the time of mounting of a semiconductor device.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, a surface parallel to the upper surface of the semiconductor substrate is referred to as the XY surface, and an orthogonal axis parallel to the upper surface and the lower surface of the semiconductor substrate is referred to as the X axis and the Y axis. Further, an axis perpendicular to the upper surface and the lower surface of the semiconductor substrate is referred to as the Z axis. The depth direction of a semiconductor substrate may be referred to as the Z axis. Additionally, as used in the present specification, the view of the semiconductor substrate in the Z axis direction is referred to as a planar view. Further, in the present specification, a direction parallel to the upper surface and the lower surface of the semiconductor substrate may be referred to as a horizontal direction, including an X axis direction and a Y axis direction.

In each embodiment example, an example in which a first conductivity type is N type and a second conductivity type is P type is described. However, the first conductivity type may be P type and the second conductivity type may be N type. In this case, conductivity types of substrates, layers, regions, or the like in each embodiment example are of respective opposite polarity.

In the present specification, a case where a term such as "identical" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set to be a positive ion concentration to the acceptor concentration set to be a negative ion concentration, taking into account of polarities of charges. As an example, when the donor concentration is $N_D$ and the acceptor concentration is $N_A$, the net net doping concentration at any position is given as $N_D-N_A$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. A VOH defect may be referred to simply as a hydrogen donor.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (srp method) may be set to be the net doping concentration. The carrier concentration measured by the CV profiling or the srp method may be a value in a thermal equilibrium state. Further, in a region of the N type, the donor concentration is sufficiently greater than the acceptor concentration, and thus the carrier concentration of the region may be set to be the donor concentration. Similarly, in a region of the P type, the carrier concentration of the region may be set to be the acceptor concentration. Each concentration in the present invention may be a value at room temperature. For the value at room temperature, a value at 300 K (Kelvin) (about 26.9° C.) may be used as an example.

Further, when a concentration distribution of the donor, acceptor, or net doping has a peak in a region, the peak value may be set to be the concentration of the donor, acceptor, or net doping in the region. In a case where the concentration of the donor, acceptor or net doping is substantially uniform in a region, or the like, an average value of the concentration of the donor, acceptor or net doping in the region may be set to be the concentration of the donor, acceptor or net doping.

The carrier concentration measured by the srp method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the srp method may be lower than a chemical concentration of an element indicating the donor or the acceptor. As an example, in a silicon semiconductor, a donor concentration of phosphorous or arsenic serving as a donor, or an acceptor concentration of boron serving as an acceptor is approximately 99% of chemical concentrations of these. On the other hand, in a silicon semiconductor, a donor concentration of hydrogen serving as a donor is, for example, approximately from 0.1% to 10% of chemical concentration of hydrogen.

Unless otherwise stated, SI unit system is used as unit system herein. Although a unit of a length may be indicated in cm or the like, various calculations may be performed after converting the unit into meters (m).

As used herein, a doping concentration refers to a concentration of a donor or an acceptorized dopant. Therefore, the unit is /cm$^3$. As used herein, a difference of concentrations of a donor and an acceptor (i.e., a net doping concentration) may be set to be the doping concentration. In this case, the doping concentration may be measured by an srp method. Moreover, a chemical concentration of the donor and the acceptor may also be set to be a doping concentration. In this case, the doping concentration can be measured by an SIMS method. Unless otherwise limited, any one of the above may be used as a doping concentration. Unless otherwise limited, a peak value of a doping concentration distribution in a doping region may be set to be a doping concentration in the doping region.

In addition, as used herein, a dosage refers to the number of ions implanted in a wafer per unit area when ions are implanted. Therefore, the unit is /cm$^2$. Note that a dosage of a semiconductor region can be taken as an integral concentration which is obtained by integrating doping concentrations across the semiconductor region in the depth direction. The unit of the integral concentration is /cm$^2$. Therefore, the dosage may be treated as the same as the integral concentration. The integral concentration may also be set to be an integral value within a half-value width. In the case of being overlapped by spectrum of another semiconductor region, the integral concentration may be derived without the influence of another semiconductor region.

Therefore, as used in the present specification, the level of the doping concentration can be read as the level of the dosage. That is, if the doping concentration of one region is higher than the doping concentration of another region, it can be understood that the dosage of the one region is higher than the dosage of the another region.

FIG. 1A is an example of a top view of a semiconductor device 100. The semiconductor device 100 includes an active region 110, an outer peripheral region 120, and a pad region 130. The semiconductor device 100 is a semiconductor chip including a transistor portion 70 and a diode portion 80. The semiconductor device 100 includes a temperature sensing portion 76, and may be mounted on a module such as IPM (intelligent power module).

The transistor portion 70 includes a transistor such as an IGBT (Insulated Gate Bipolar Transistor). The diode portion 80 includes a diode such as a free wheel diode (FWD). The semiconductor device 100 of the present example is a reverse conducting IGBT (RC-IGBT) having a transistor portion 70 and a diode portion 80 on the same chip. In the present example, the transistor of the transistor portion 70 is an IGBT.

The semiconductor substrate 10 may be a silicon substrate, a silicon carbide substrate, or a nitride semiconductor substrate or the like such as gallium nitride. The semiconductor substrate 10 in the present example is a silicon substrate. The semiconductor substrate 10 has an active region 110 and an outer peripheral region 120.

The transistor portion 70 and the diode portion 80 may be arranged alternately in a cyclical manner on the XY plane. The semiconductor device 100 of the present example includes a plurality of transistor portions 70 and a plurality of diode portions 80 respectively. The transistor portion 70 and the diode portion 80 of the present example have trench portions that extend in the Y axis direction. However, the transistor portion 70 and the diode portion 80 may have trench portions that extend in the X axis direction.

A temperature sensing portion 76 is provided above an active region 110. The temperature sensing portion 76 may be formed of monocrystalline or polycrystalline silicon. When the temperature of the semiconductor device 100 changes, the forward voltage of a current flowing in the temperature sensing portion 76 changes. Based on the change of the forward voltage, the temperature of the semiconductor device 100 can be detected.

The active region 110 has the transistor portion 70 and the diode portion 80. The active region 110 is a region where the main current flows between the front surface and the back surface of the semiconductor substrate 10 when the semiconductor device 100 is controlled to be an ON-state. That is, it is a region in which the current flows through the interior of the semiconductor substrate 10 from the front surface to the back surface or from the back surface to the front surface of the semiconductor substrate 10 in the depth direction. In the present specification, the transistor portions 70 and the diode portions 80 may be referred to as an element portion or an element region respectively.

Moreover, in a top view, a region sandwiched by two element portions is referred to as an active region 110. In the present example, a region where a gate runner 51 is provided being sandwiched by element portions is included in the active region 110.

The gate runner 51 may supply gate potential supplied from a gate pad 131 of a pad region 130, to a gate conductive portion of the transistor portion 70. The gate runner 51 is, in a top view, provided along the outer periphery of the active region 110. The gate runner 51 may be, in a top view, provided in the region between the transistor portion 70 and the diode portion 80.

The outer peripheral region 120 is, in a top view, provided around an end portion of the semiconductor substrate 10 so as to enclose the active region 110 and the pad region 130. It is a region between the active region 110 and the pad region 130 and the outer peripheral edge of the semiconductor substrate 10. The outer peripheral region 120 is, in a top view, provided around the active region 110. The outer peripheral region 120 may have an edge termination structure portion. The edge termination structure portion reduces electric field strength at the side of the front surface of the semiconductor substrate 10. For example, the edge termination structure portion has a structure of a guard ring, a field plate, an RESURF, and a combination thereof.

The pad region 130 has a gate pad 131, a sense-IGBT 132, a sense-emitter pad 133, an anode pad 134, and a cathode pad 135. In the present example, a cathode pad 135, an anode pad 134, a gate pad 131, a sense-IGBT 132, and a sense-emitter pad 133 are provided in a row in the X axis direction in this order. Each pad may be an electrode pad including gold (Au), silver (Ag), copper (Cu), aluminum (Al), or the like.

The gate pad 131 is electrically connected to a gate conductive portion of the transistor portion 70 via a gate runner 51. The gate pad 131 is set to a gate potential.

The sense-IGBT 132 is an IGBT for detecting a main current that flows in the transistor portion 70. A current proportional to a main current that flows in the transistor portion 70 flows in the sense-IGBT 132. By taking the sense-current flowing in the sense-IGBT 132 into a control circuit provided in the exterior to the semiconductor device 100 allows the main current of the transistor portion 70 to be detected. The sense-emitter pad 133 of the present example has the same potential as the emitter of the sense-IGBT 132. The sense-current may be taken into the above-described control circuit from the sense-emitter pad 133 via the sense-IGBT 132. The control circuit may sense the main current based on the sense-current so as to shut down a current flowing in the transistor portion 70 when a overcurrent is flowing in the transistor portion 70.

An anode pad 134 is electrically connected to the temperature sensing portion 76, and set to the anode potential of the temperature sensing portion 76. Similarly, a cathode pad 135 is electrically connected to the temperature sensing portion 76, and set to the cathode potential of the temperature sensing portion 76. The use of the anode pad 134 and the cathode pad 135 allows potential differences between the anode and the cathode of the temperature sensing portion 76 to be sensed.

Figure 1B:
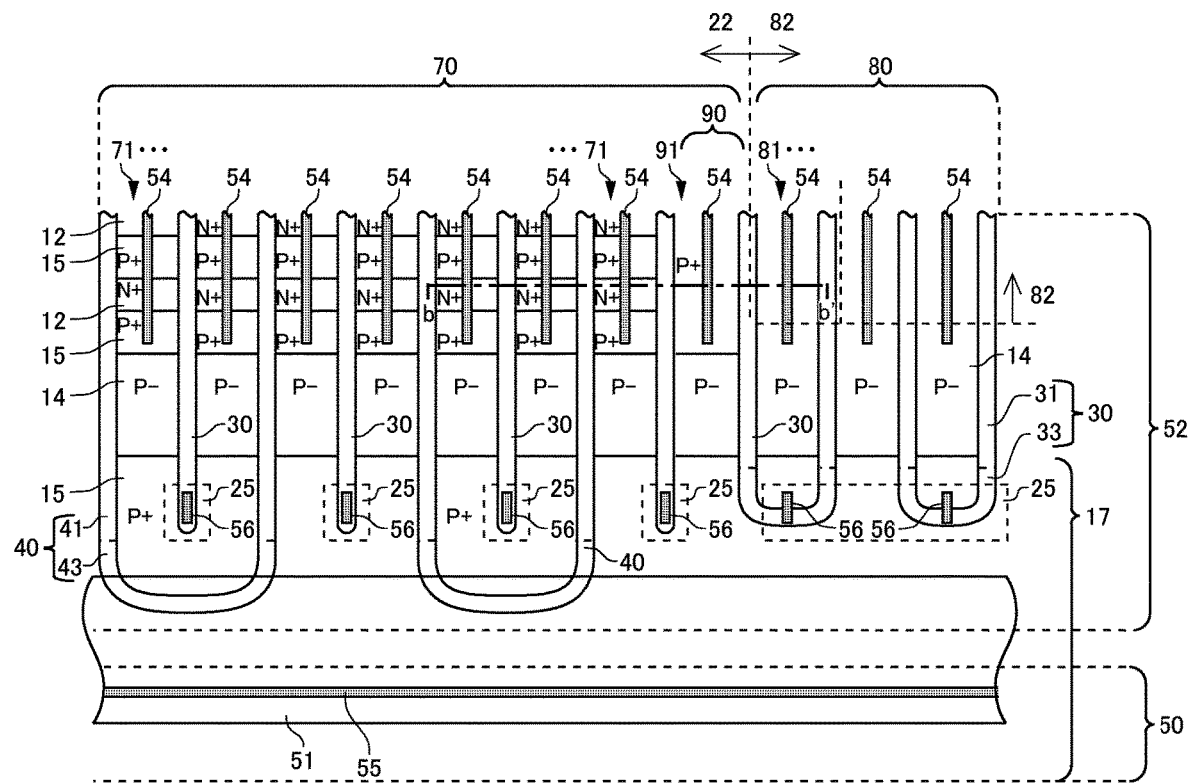
FIG. 1B is an example of a top view of the semiconductor device 100 which corresponds to the region A of FIG. 1A.

FIG. 1B is an example of a top view of the semiconductor device 100 which corresponds to the region A of FIG. 1A. That is, FIG. 1B shows an enlarged view of the end portion of the active region 110.

The transistor portion 70 is a region where the collector region 22 provided on the back surface side of the semiconductor substrate 10 is projected onto a front surface of the semiconductor substrate 10. The collector region 22 has the second conductivity type. The collector region 22 of the present example is of P+ type, by way of example. The transistor portion 70 includes a boundary portion 90 that is positioned in a boundary between the transistor portion 70 and the diode portion 80.

The diode portion 80 is a region where the cathode region 82 provided on the back surface side of the semiconductor substrate 10 is projected onto the front surface of the semiconductor substrate 10. The cathode region 82 has the first conductivity type. The cathode region 82 of the present example is of N+ type, by way of example.

The semiconductor device 100 in the present example includes a gate trench portion 40, a dummy trench portion 30, an emitter region 12, a base region 14, a contact region 15, and a well region 17, in the front surface of the semiconductor substrate 10. In addition, the semiconductor device 100 of the present example includes an emitter electrode 52 and a gate metal layer 50 provided above the front surface of the semiconductor substrate 10.

The emitter electrode 52 is provided above the gate trench portion 40, the dummy trench portion 30, the emitter region 12, the base region 14, the contact region 15 and the well region 17. Also, the gate metal layer 50 is provided above the well region 17 and the gate runner 51. The emitter electrode 52 of the present example is set to an emitter potential of the transistor portion 70.

The gate metal layer 50 is electrically connected to the gate conductive portion of the transistor portion 70 and supplies a gate voltage to the transistor portion 70. The gate metal layer 50 is electrically connected with the gate pad 131. The gate metal layer 50 is, in a top view, provided along the outer periphery of the active region 110. The gate metal layer 50 may be, in a top view, provided in the region between the transistor portion 70 and the diode portion 80.

The gate runner 51 connects the gate metal layer 50 with a gate conductive portion within the gate trench portion 40. The gate runner 51 is not connected to a dummy conductive portion in the dummy trench portion 30. For example, the gate runner 51 is formed of polysilicon doped with impurities, or the like.

The emitter electrode 52 and the gate metal layer 50 are formed of a material including metal. For example, at least partial region of the emitter electrode 52 may be formed of aluminum, aluminum-silicon alloy, or aluminum-silicon-copper alloy. The emitter electrode 52 may include barrier metal formed of titanium, titanium compound, and the like under the region formed of aluminum and the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1B. A contact hole 54, a contact hole 55, and a contact hole 56 are provided through the interlayer dielectric film 38.

The contact hole 55 connects the gate metal layer 50 with the gate runner 51. Inside the contact hole 55, a plug formed of tungsten or the like may be formed. The contact hole 55 may be provided along the gate runner 51.

The contact hole 56 connects the emitter electrode 52 with a dummy conductive portion in a dummy trench portion 30. Inside the contact hole 56, a plug formed of tungsten or the like may be formed.

A connection portion 25 electrically connects the emitter electrode 52 with a plug in the interior of the contact hole 56. The connection portion 25 has a conductive material such as polysilicon doped with impurities. The connection portion 25 of the present example is a polysilicon layer doped with impurities of the N type. The connection portion 25, in a top view, covers a range larger than the contact hole 56. The connection portion 25 is provided above the front surface of the semiconductor substrate 10 via a dielectric film such as an oxide film, or the like.

The gate trench portion 40 is arranged at a predefined interval along a predefined arrangement direction (the X axis direction in the present example). The gate trench portion 40 in the present example may have two extending portions 41 extending along the extending direction (in the present example, the Y axis direction) that is parallel to the front surface of the semiconductor substrate 10 and perpendicular to the arrangement direction and a connection section 43 connecting the two extending portions 41.

At least a part of the connection section 43 is preferably formed in a curved shape. By connecting end portions of the two extending portions 41 of the gate trench portions 40, an electric field strength at the end portions of the extending portions 41 can be reduced. In the connection section 43 of the gate trench portion 40, the gate runner 51 may be connected with the gate conductive portion.

The dummy trench portion 30 is a trench portion electrically connected with the emitter electrode 52. The dummy trench portion 30 is arranged, similarly to the gate trench portion 40, at a predefined interval along a predefined arrangement direction (the X axis direction in the present example). The dummy trench portion 30 of the present example may have, similarly to the gate trench portion 40, a U shape on the front surface of the semiconductor substrate 10. That is, the dummy trench portion 30 may have two extending portions 31 extending along the extending direction and a connection section 33 connecting the two extending portions 31.

The well region 17 is a region of a second conductivity type provided closer to the front surface of the semiconductor substrate 10 than the drift region 18, which will be described below. The well region 17 is an example of the well region provided on the edge side of the semiconductor device 100. The well region 17 is of P+ type, by way of example. The well region 17 is formed within a predefined range from the end portion of the active region 110 of the side provided with the gate metal layer 50. A diffusion depth of the well region 17 may be deeper than depths of the gate trench portion 40 and the dummy trench portion 30. Partial regions of the gate trench portion 40 and the dummy trench portion 30 on the gate metal layer 50 side are formed in the well region 17. The bottoms at the end of the extending direction of the gate trench portion 40 and the dummy trench portion 30 may be covered by the well region 17.

The contact hole 54 is formed above each region of the emitter region 12 and the contact region 15 in the transistor portion 70. Also, the contact hole 54 is provided above the base region 14 in the diode portion 80. The contact hole 54 is provided above the contact region 15 in the boundary portion 90. No contact hole 54 is provided above the well region 17 provided on the both ends in the extending direction. In this manner, one or more contact holes 54 are formed in the interlayer dielectric film 38. One or more contact holes 54 may be provided to extend in the extending direction.

The boundary portion 90 is a region provided in the transistor portion 70 and adjacent to the diode portion 80. The boundary portion 90 includes the contact region 15. The boundary portion 90 of the present example does not include the emitter region 12. The boundary portion 90 of the present example is arranged so that both ends in the arrangement direction become dummy trench portions 30.

The mesa portion 71, the mesa portion 91 and the mesa portion 81 are mesa portions provided adjacent to the trench portions, in a plane parallel to the front surface of the semiconductor substrate 10. The mesa portion may be a portion of the semiconductor substrate 10 sandwiched between two adjacent trench portions, which is located from the front surface of the semiconductor substrate 10 to the depth of the deepest bottom portion of each trench portion. The extending portions of each trench portion may be set to be one trench portion. That is, the region sandwiched between two extending portions may be set to be a mesa portion.

The mesa portion 71 is provided adjacent to at least one of the dummy trench portion 30 or the gate trench portion 40 in the transistor portion 70. The mesa portion 71 has the well region 17, the emitter region 12, the base region 14, and the contact region 15, in the front surface of the semiconductor substrate 10. In the mesa portion 71, the emitter region 12 and the contact region 15 are provided alternately in the extending direction.

The mesa portion 91 is provided in the boundary portion 90. The mesa portion 91 has, on the front surface of the semiconductor substrate 10, a base region 14, a contact region 15, and a well region 17. Although the mesa portion 91 of the present example has both ends in the arrangement direction in contact with the dummy trench portion 30, at least one may be in contact with the gate trench portion 40. In the present example, although one mesa portion 91 is provided, a plurality of mesa portions 91 may be provided.

The mesa portion 81 is provided in a region interposed between the dummy trench portions 30 adjacent to each other in the diode portion 80. The mesa portion 81 has, on the front surface of the semiconductor substrate 10, a base region 14, and a well region 17.

The base region 14 is a region of second conductivity type provided in the transistor portion 70 and the diode portion 80 on the side of the front surface of the semiconductor substrate 10. The base region 14 is of the P− type, by way of example. The base region 14 may be, in the front surface of the semiconductor substrate 10, provided in both end portions in the extending direction of the mesa portion 71 and the mesa portion 91. Moreover, FIG. 1B shows only one end portion in the extending direction of the base region 14.

The emitter region 12 is a region of the first conductivity type having a higher doping concentration than that of the drift region 18. The emitter region 12 of the present example is of N+ type, by way of example. An example of a dopant of the emitter region 12 is arsenic (As). The emitter region 12 is provided in contact with the gate trench portion 40 in the front surface of the mesa portion 71. The emitter region 12 may be provided being extended in the arrangement direction from one trench portion to the other trench portion of two trench portions that sandwich the mesa portion 71. The emitter region 12 is also provided below the contact hole 54.

In addition, the emitter region 12 may or may not be in contact with the dummy trench portion 30. The emitter region 12 in the present example is in contact with the dummy trench portion 30. The emitter region 12 may not be provided in the mesa portion 91 of the boundary portion 90.

The contact region 15 is a region of the second conductivity type having a higher doping concentration than that of the base region 14. The contact region 15 of the present example is of P+ type, by way of example. The contact region 15 of the present example is provided on the front surfaces of the mesa portion 71 and the mesa portion 91. The contact region 15 may be provided in the arrangement direction from one trench portion to the other trench portion of two trench portions that sandwich the mesa portion 71 or the mesa portion 91. The contact region 15 may be or may not be in contact with the gate trench portion 40. Moreover, the contact region 15 may be or may not be in contact with the dummy trench portion 30. In the present example, the contact region 15 is in contact with the dummy trench portion 30 and the gate trench portion 40. The contact region 15 is also provided below the contact hole 54. Moreover, the contact region 15 may also be provided in the mesa portion 81.

Figure 1C:
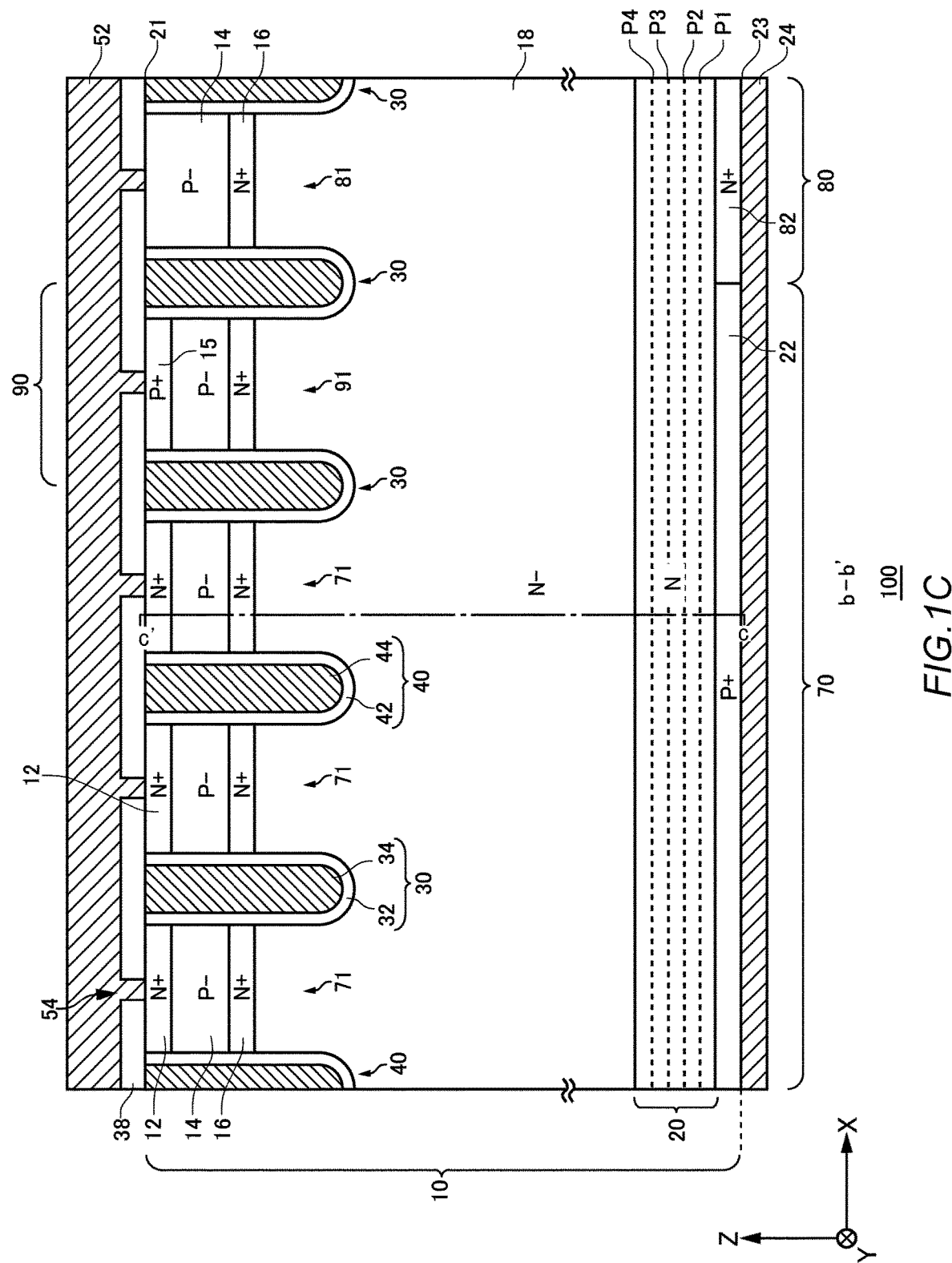
FIG. 1C is a diagram showing an example in the cross section b-b' of FIG. 1B.

FIG. 1C is a diagram showing an example in the cross section b-b' of FIG. 1B. The cross section b-b' is, in the transistor portion 70, an XZ surface that passes through the emitter region 12. The semiconductor device 100 of the present example includes, in the cross section b-b', the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type provided in the semiconductor substrate 10. The drift region 18 of the present example is of N− type, by way of example. The drift region 18 may be a remaining region where another doping region is not formed in the semiconductor substrate 10. That is, the doping concentration of the drift region 18 may be a doping concentration of the semiconductor substrate 10.

The field stop region 20 is a region of the first conductivity type provided below the drift region 18. The field stop region 20 of the present example is of N type, by way of example. The doping concentration of the field stop region 20 is higher than a doping concentration of the drift region 18. The field stop region 20 prevents a depletion layer spreading from the side of the lower surface of the base region 14 from reaching to the collector region 22 of the second conductivity type and the cathode region 82 of the first conductivity type.

The field stop region 20 may have one or more peaks. The field stop region 20 of the present example has four peaks of the first peak P1 to the fourth peak P4. The dopant of one or more peaks may be hydrogen.

The first peak P1 to the fourth peak P4 are provided in the order from the back surface 23 in this order. That is, the first peak P1 is a peak that is the closest to the back surface 23. The doping concentration of the first peak P1 may be higher than the doping concentration of the other peaks. Thereby, a depletion layer when a voltage is applied can be slowly and surely stopped.

The collector region 22 is, in the transistor portion 70, provided below the field stop region 20. The cathode region 82 is, in the diode portion 80, provided below the field stop region 20. The boundary between the collector region 22 and the cathode region 82 is a boundary between the transistor portion 70 and the diode portion 80.

The collector electrode 24 is formed on the back surface 23 of the semiconductor substrate 10. The collector electrode 24 is formed of a conductive material such as metal.

The base region 14 is a region of the second conductivity type provided above the drift region 18, in the mesa portion 71, the mesa portion 91, and the mesa portion 81. The base region 14 is provided in contact with gate trench portion 40. The base region 14 may be provided in contact with the dummy trench portion 30.

The emitter region 12 is, in the mesa portion 71, provided between the base region 14 and the front surface 21. The emitter region 12 is provided in contact with the gate trench portion 40. The emitter region 12 may be or may not be in contact with the dummy trench portion 30. Moreover, the emitter region 12 may not be provided in the mesa portion 91.

The contact region 15 is provided above the base region 14 in the mesa portion 91. The contact region 15 is provided in contact with the dummy trench portion 30 in the mesa portion 91. In another cross section, the contact region 15 may be provided on the front surface 21 in the mesa portion 71.

An accumulation region 16 is a region of the first conductivity type provided closer to the front surface 21 of the semiconductor substrate 10 than the drift region 18. The accumulation region 16 of the present example is of N+ type, by way of example. The accumulation region 16 is provided in the transistor portion 70 and the diode portion 80. The accumulation region 16 of the present example is also provided in the boundary portion 90.

In addition, the accumulation region 16 is provided in contact with the gate trench portion 40. The accumulation region 16 may be or may not be in contact with the dummy trench portion 30. The doping concentration of the accumulation region 16 is higher than the doping concentration of the drift region 18. Providing the accumulation region 16 can enhance the carrier injection enhancement effect (IE effect) to reduce the ON voltage of the transistor portion 70.

One or more gate trench portions 40 and one or more dummy trench portions 30 are provided on the front surface 21. Each trench portion is provided from the front surface 21 to the drift region 18. In the region where at least any one of the emitter region 12, the base region 14, the contact region 15, and the accumulation region 16 is provided, each trench portion also penetrates these regions to reach the drift region 18. The configuration of the trench portion penetrating the doping region is not limited to the one manufactured in the order of forming the doping region and then forming the trench portion. The configuration of the trench portion penetrating the doping region also includes a configuration of the doping region being formed between the trench portions after forming the trench portion.

The gate trench portion 40 has a gate trench, a gate dielectric film 42, and a gate conductive portion 44 that are formed in the front surface 21. The gate dielectric film 42 is formed to cover an inner wall of the gate trench. The gate dielectric film 42 may be formed by oxidizing or nitriding a semiconductor on the inner wall of the gate trench. The gate dielectric film 42 is formed in the interior of the gate trench, and the gate conductive portion 44 is formed inside the gate dielectric film 42. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 in the front surface 21.

The gate conductive portion 44 includes a region opposing the adjacent base region 14 in the mesa portion 71 side by sandwiching the gate dielectric film 42, in the depth direction of the semiconductor substrate 10. When a predefined voltage is applied to the gate conductive portion 44, a channel as an inversion layer of electrons is formed in the interfacial surface layer of the base region 14 that is in contact with the gate trench.

The dummy trench portion 30 may have the identical structure as that of the gate trench portion 40. The dummy trench portion 30 has a dummy trench, a dummy dielectric film 32 and a dummy conductive portion 34 that are formed on the side of the front surface 21. The dummy dielectric film 32 is formed covering the inner walls of the dummy trench. The dummy conductive portion 34 is formed in the interior of the dummy trench and formed inside the dummy dielectric film 32. The dummy dielectric film 32 insulates the dummy conductive portion 34 from the semiconductor substrate 10. The dummy trench portion 30 is covered by the interlayer dielectric film 38 in the front surface 21.

The interlayer dielectric film 38 is provided in the front surface 21. The emitter electrode 52 is provided above the interlayer dielectric film 38. In the interlayer dielectric film 38, one or more contact holes 54 are provided for electrically connecting the emitter electrode 52 with the semiconductor substrate 10. The contact hole 55 and the contact hole 56 may also be provided extending through the interlayer dielectric film 38.

Figure 1D:
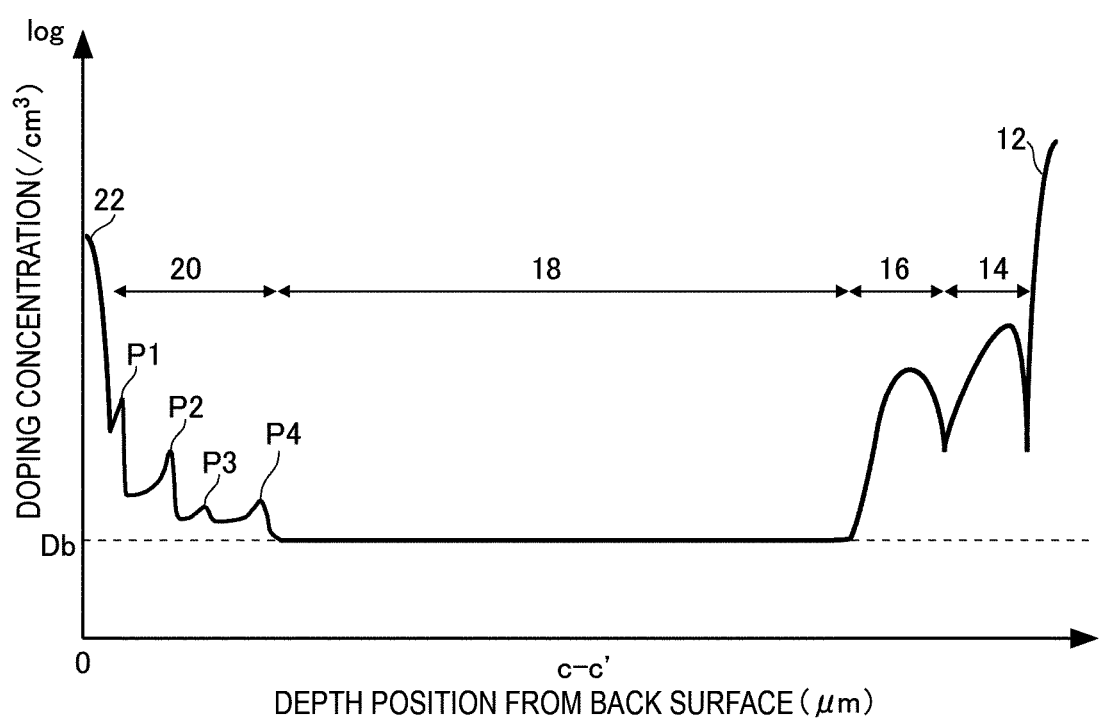
FIG. 1D is a diagram showing an example of a doping concentration distribution in the depth direction in the position of the line c-c' in FIG. 1C.

FIG. 1D is a diagram showing an example of a doping concentration distribution in the depth direction in the position of the line c-c' in FIG. 1C. The line c-c', in the transistor portion 70, passes through from the emitter region 12 to the collector region 22. The vertical axis in FIG. 1D is the logarithmic axis. Moreover, although, in the present example, a doping concentration distribution of the field stop region 20 in the transistor portion 70 is described, the field stop region 20 in the diode portion 80 may also have similar doping concentration distribution.

A doping concentration of the drift region 18 of the present example is a bulk donor concentration Db. A bulk donor of the first conductivity type (N type) is distributed throughout the semiconductor substrate 10 of the present example. The bulk donor is a dopant donor substantially uniformly contained in an ingot during the manufacture of the ingot from which the semiconductor substrate 10 is made. The bulk donor of the present example is an element other than hydrogen. Although the dopant of the bulk donor is, for example, phosphorous, antimony, arsenic, selenium, and sulfur, it is not limited to these. The bulk donor in the present example is phosphorous. The bulk donor is also contained in the P type region. The semiconductor substrate 10 may be a wafer cut out from an ingot of a semiconductor, or may be a chip made from making a wafer into an individual piece. The semiconductor ingot may be manufactured by either a Chokralsky method (CZ method), a magnetic field applied Chokralsky method (MCZ method), or a float zone method (FZ method). The ingot in the present example is manufactured by the MCZ method. For a bulk donor concentration Db, a chemical concentration of a donor that is distributed throughout the semiconductor substrate 10 may be used, and it may be a value between from 90% to 100% of the chemical concentration.

In the present example, a case where a doping concentration distribution in the field stop region 20 has four concentration peaks P1, P2, P3, P4 in different positions in the depth direction is described. However, the number of the concentration peaks is not limited to this. A concentration peak in the present example is a peak of donor concentration. A plurality of concentration peaks can be formed by implanting impurities such as hydrogen or phosphorous into a plurality of depth positions of the field stop region 20. As an example, the position of P1 is set to be phosphorous, and for the P2 to P4, hydrogen as donors may be used. In the present example, for all of P1 to P4 hydrogen as donors are used. The field stop region 20 may have concentration peaks of impurities such as hydrogen or phosphorous at the position corresponding to a concentration peak. The concentration peak of impurities is a peak in the chemical concentration distribution of impurities. Providing the plurality of concentration peaks can suppress the depletion layer from reaching the collector region 22 better.

Figure 1E:
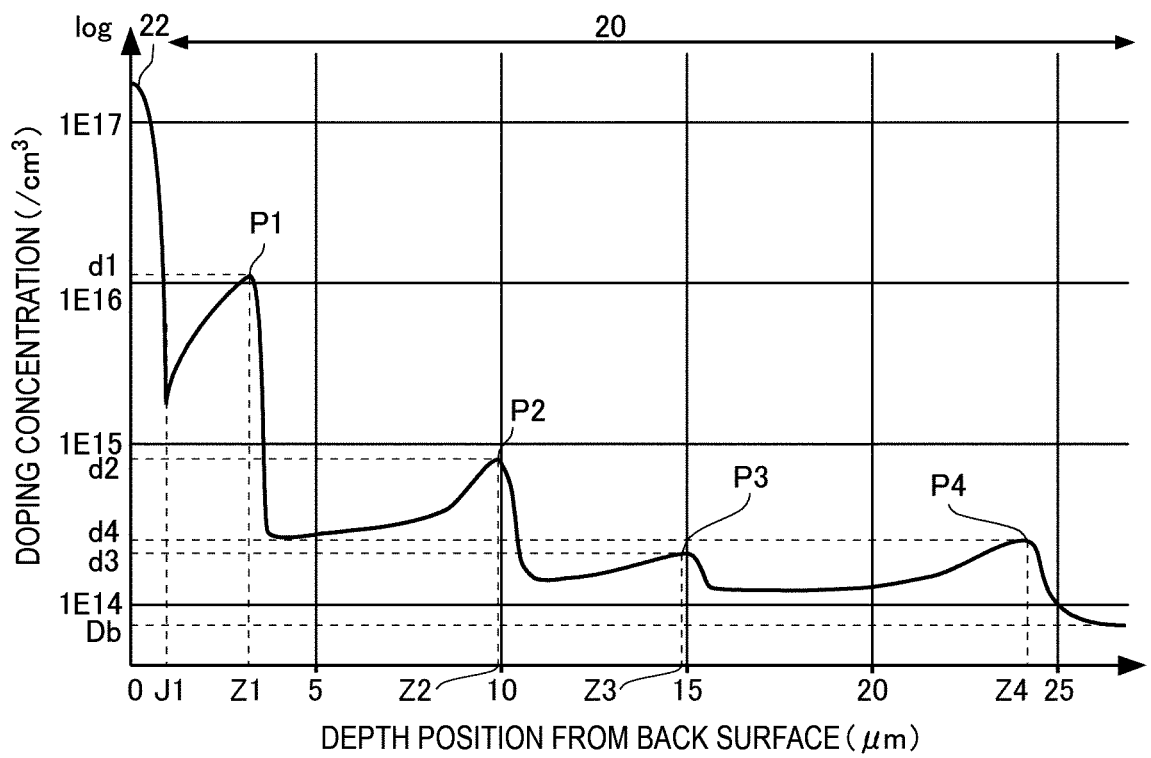
FIG. 1E is an enlarged view of a field stop region 20 and a collector region 22 in FIG. 1D.

FIG. 1E is an enlarged view of a doping concentration distribution in the field stop region 20 and a collector region 22 of FIG. 1C. The vertical axis in FIG. 1E is the logarithmic axis. In FIG. 1E, the peak values of doping concentrations of a plurality of concentration peaks P1, P2, P3, P4 are d1, d2, d3, d4 respectively. Also, the depth of pn junction between the collector region 22 and the field stop region 20 is set to be J1.

A plurality of concentration peaks includes shallowest peak closest to the back surface 23 of the semiconductor substrate 10. In the present example, the concentration peak P1 corresponds to shallowest peak. The concentration peak P1 of the present example is a concentration peak closest to the collector region 22. In the field stop region 20 of the diode portion 80, the concentration peak P1 is a concentration peak that is the closest to the cathode region 82. The cathode region 82 may be formed by implanting impurities different from concentration peaks. For example, the cathode region 82 has an impurity concentration peak such as that of phosphorous, and the field stop region 20 has concentration peaks of impurities such as that of hydrogen.

A plurality of concentration peaks includes high concentration peaks arranged in positions that are apart from the back surface 23 than the shallowest peak (the concentration peak P1). The high concentration peak may be a concentration peak P2 closest to the shallowest peak, or may be another concentration peak. In the example of FIG. 1E, the concentration peak P2 closest to the concentration peak P1 corresponds to the high concentration peak.

A plurality of concentration peaks includes low concentration peaks arranged in positions that are apart from the back surface 23 than the high concentration peaks, and whose peak values of doping concentrations are 1/5 or less of peak values of the high concentration peaks. The low concentration peak may be the deepest peak (in the present example, the concentration peak P4) arranged the furthest from the back surface 23 among a plurality of concentration peaks. The low concentration peak may be a concentration peak other than the deepest peak. That is, the low concentration peak may be a concentration peak between the high concentration peaks and the deepest peak.

Also, two or more low concentration peaks may be provided. The low concentration peak is preferably arranged next to each other in the depth direction. Among a plurality of concentration peaks, two or more concentration peaks arranged furthest from the back surface 23 may be low concentration peaks. In the example of FIG. 1E, the concentration peak P4 that is the deepest peak, the concentration peak P3 provided in a position that is the next furthest after the deepest peak toward the back surface 23 from the back surface 23, and the concentration peak P2 that is the next closest after the P3 to the back surface 23 are low concentration peaks. A concentration peak other than the concentration peak that is the closest to the back surface 23 may be set to be a low concentration peak. In the example of FIG. 1E, either the peak value d3 of a doping concentration of the concentration peak P3 or the peak value d4 of a doping concentration of the concentration peak P4 is 1/5 or less of the peak value d1 of a doping concentration of the concentration peak P1. The concentration peak d2 to d4 of the low concentration peaks P2 to P4 may be 1/10 or less of the peak value d1 of the concentration peak P1. Moreover, in the present example, the peak value d3 of P3 is lower than the peak value d4 of P4. The peak value d3 of P3 may be higher than the peak value d4 of P4. That is, peak values from P2 to P4 may fall toward the front surface 21.

In a short circuit state or the like where two semiconductor devices 100 connected in series get switched to an ON-state at the same time, a high-voltage may be applied between an emitter and a collector of the semiconductor devices 100. In this case, electric fields tend to concentrate in the vicinity of the deepest peak (in the present example, the concentration peak P4) in the field stop region 20. Therefore, if a doping concentration in the vicinity of the deepest peak is raised as in the concentration peak P3 and the concentration peak P4, and the like, it ends up promoting a concentration of electric fields. If electric fields concentrate, the gate voltage tends to vibrate when the semiconductor device 100 turns off or the like.

The concentration peak of the present example provides low concentration peaks whose doping concentration is sufficiently small in a position that is deeper than the high concentration peak (the concentration peak P1). Therefore, an electric field strength in deep positions of the field stop region 20 can be reduced. As described above, there may be one or more low concentration peaks, and a plurality of them may be provided. This allows the field stop region 20 with relatively low concentration to be formed elongated on the side of the side of the drift region 18. In the example of FIG. 1E, although the field stop region 20 has three low concentration peaks, in another example, the field stop region 20 may have four or more low concentration peaks. Also, the deepest peak may be provided on the side of the front surface 21 of the semiconductor substrate 10. By forming a low concentration region elongated in the depth direction while making the side of the drift region 18 of the field stop region 20 a low concentration region, it becomes easy to maintain field stop function while reducing electric field strength.

The peak values of doping concentrations of low concentration peaks may be 1/5 or less of peak values of doping concentrations of high concentration peaks, may be 1/10 or less, or may be 1/20 or less. By decreasing doping concentration of low concentration peak, an electric field strength can be reduced more.

Also, the peak values of doping concentrations of low concentration peaks are higher than a bulk donor concentration Db. The peak values of doping concentrations of low concentration peaks may be 50-fold or less of a bulk donor concentration Db of the semiconductor substrate 10. The doping concentration of the drift region 18 may be used as a bulk donor concentration Db. The peak values of doping concentrations of low concentration peaks may be 20-fold or less, 10-fold or less, 8-fold or less, 5-fold or less, 3-fold or less, or 2-fold or less of a bulk donor concentration Db.

Also, a local minimum value of doping concentration between peaks of low concentration peaks may be higher than a bulk donor concentration Db, or may be 5-fold or less, 3-fold or less, or 2-fold or less of a bulk donor concentration Db. The ratio of local minimum values between peaks for one of the peak concentrations of adjacent low concentration peaks may be 0.8 or less, 0.5 or less, 0.2 or less, 0.1 or more, 0.2 or more, or 0.5 or more.

The positions in the depth direction of the concentration peak P1, P2, P3, P4 are set to be Z1, Z2, Z3, Z4 respectively. The distance between the concentration peak P4 and the concentration peak P2 in the depth direction is Z4-Z2. Also, the distance between the concentration peak P1 and the concentration peak P2 in the depth direction is Z2-Z1. The distance Z4-Z2 may be greater than the distance Z2-Z1. Also, the distance between the concentration peak P3 and the concentration peak P4 is Z4-Z3. The distance between the concentration peak P3 and the concentration peak P2 in the depth direction is Z3-Z2. The distance Z4-Z3 may be greater than the distance Z3-Z2. Also, the distance Z4-Z3 may be greater than the distance Z2-Z1.

Also, the peak value of doping concentration of the concentration peak P4 may be 1/5 or less of peak values of doping concentrations of the high concentration peaks, may be 1/10 or less, or may be 1/20 or less. The peak value of doping concentration of the concentration peak P4 is higher than a bulk donor concentration Db. The average value of the concentration peak P4 and the peak value of doping concentration of the concentration peak P3 may be 50-fold or less, 20-fold or less, 10-fold or less, 8-fold or less, 5-fold or less, 3-fold or less, or 2-fold or less of a bulk donor concentration Db. By making the average value of doping concentration of the two deepest concentration peaks small, the electric field strength in the field stop region 20 of the vicinity of the drift region 18 can be reduced.

In the present example, in the pn junction J1 between the collector region 22 and the field stop region 20, a donor concentration or an acceptor concentration may be $1E16/cm^3$ or less, $5E15/cm^3$ or less, or $2E15/cm^3$ or less. Moreover, E means exponentiations of 10, for example, $1E16/cm^3$ means $1\times10^{16}/cm^3$.

Figure 1F:
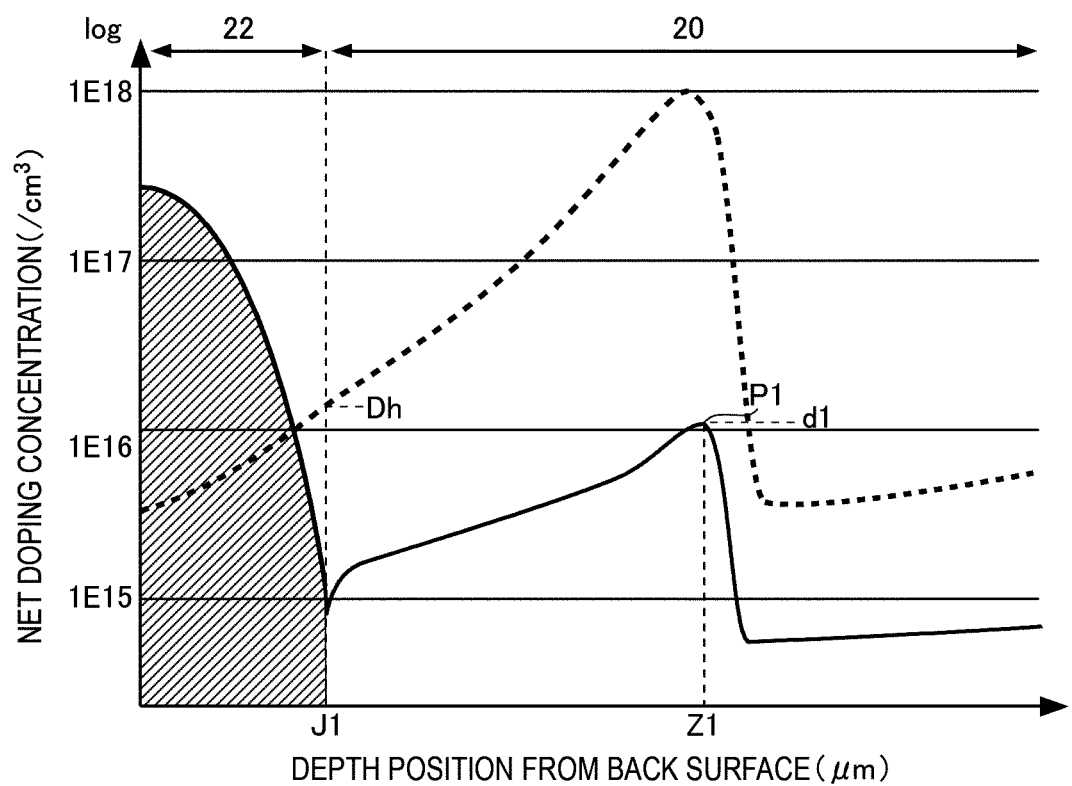
FIG. 1F is a diagram showing an example of distributions of a net doping concentration in the depth direction and a hydrogen chemical concentration in a first concentration peak and the collector region 22.

FIG. 1F is a diagram showing an example of the distributions of a net doping concentration in the depth direction and a hydrogen chemical concentration in the first concentration peak and the collector region 22. The solid line represents an example of a distribution of a net doping concentration, and the broken line represents an example of a distribution of a hydrogen chemical concentration. The vertical axis in FIG. 1F is the logarithmic axis. Here, the diagonally shaded regions in FIG. 1F are an integral concentration of the collector region 22 in the present example. That is, in the present specification, the integral concentration of the collector region 22 means a concentration that results from integrating the net doping concentration of the collector region 22 from the back surface to the pn junction position J1 of the field stop region 20, in the depth direction of the semiconductor substrate 10. Also, the hydrogen chemical concentration Dh in the pn junction J1 between the collector region 22 and the field stop region 20 may be $1E18/cm^3$ or less, $1E17/cm^3$ or less, $1E16/cm^3$ or more, or $1E15/cm^3$ or more.

Figure 1G:
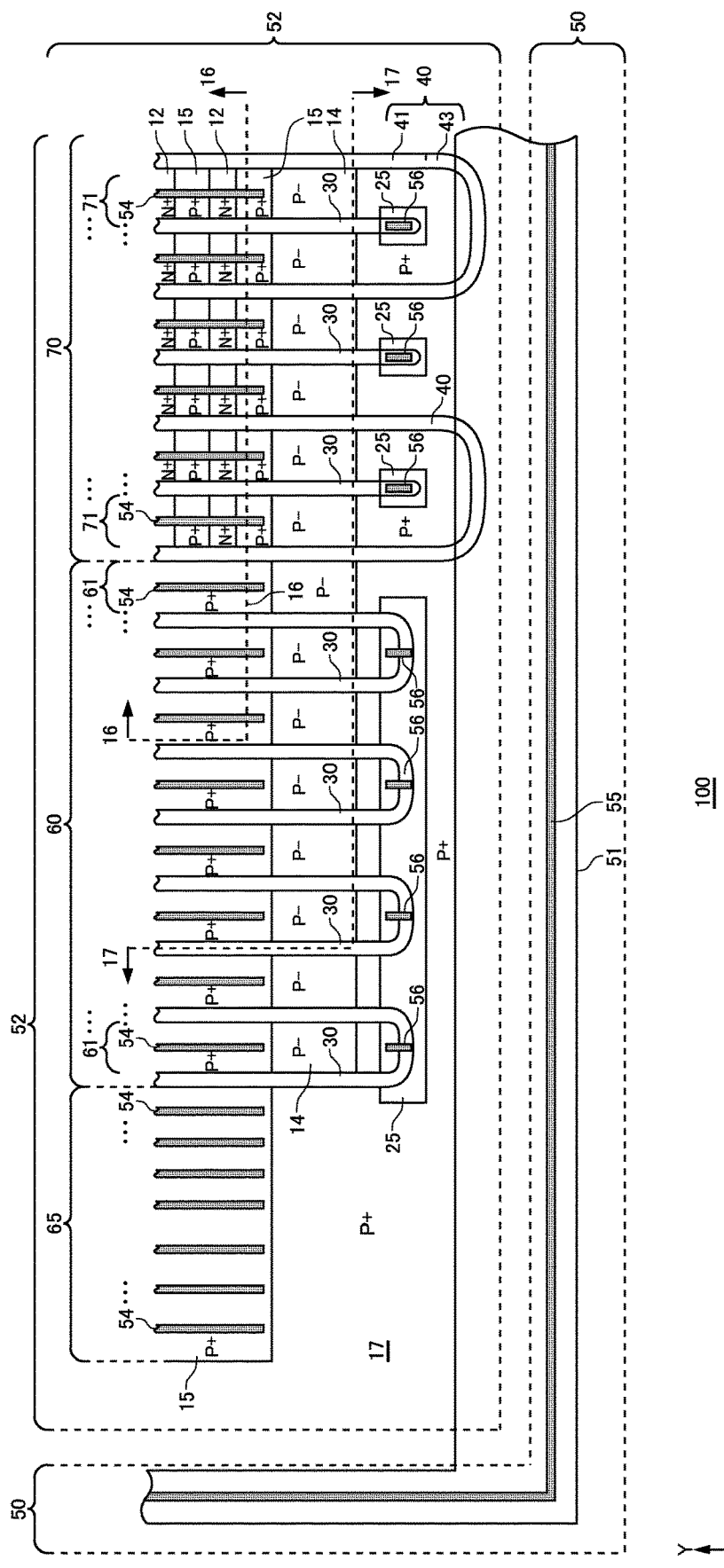
FIG. 1G is an example of a top view of the semiconductor device 100 which corresponds to the region B of FIG. 1A.

FIG. 1G is an example of a top view of the semiconductor device 100 which corresponds to the region B of FIG. 1A. In the present example, FIG. 1G shows an enlarged view of the end portion of the active region 110. The region B is a region that includes the transistor portion 70 and the gate runner 51 of the active region 110. The semiconductor device 100 of the present example includes the dummy trench region 60 and the well-contact region 65.

The dummy trench region 60 is a region that has only the dummy trench portion 30 as a trench portion. The dummy trench region 60 is, in the arrangement direction, provided between the gate trench portion 40 that is the closest to the outer peripheral region 120, and the outer peripheral region 120. The dummy trench region 60 has a plurality of dummy trench portions 30 spaced by a given interval in the arrangement direction.

The well-contact region 65 is provided in a part of the well region 17, and the well-contact region 65 extracts a hole injected from the collector region 22 to the emitter electrode 52. The well-contact region 65 has the contact regions 15. The contact hole 54 is provided above the contact region 15 of the well-contact region 65. The contact region 15 is electrically connected to the emitter electrode 52 via a plurality of contact holes 54. Moreover, the semiconductor device 100 may not include the well-contact region 65.

In the mesa portion 61 are provided the base region 14, the contact region 15, and the well region 17. The contact region 15 is, in the mesa portion 61, provided from one of dummy trench portions 30 adjacent in the arrangement direction to the other dummy trench portions 30. Because the mesa portion 61 of the present example has a contact region 15, it becomes easy to extract a hole, when compared to the case without having the contact region 15. This prevents the destruction of the semiconductor device 100 by the concentration of an avalanche current in the end portion of the well region 17.

The emitter electrode 52 is provided above the dummy trench region 60 and the well-contact region 65. The emitter electrode 52 is electrically connected to the front surface 21 of the semiconductor substrate 10 in each of the dummy trench region 60, the well-contact region 65, and the transistor portion 70, via the contact hole 54.

The well region 17 is, in a top view, provided around the side of an outer periphery of the active region 110. The inside end portion of the well region 17 is shown by a broken line.

The accumulation region 16 is provided extending from the transistor portion 70 to the dummy trench region 60. The accumulation region 16 of the present example is provided extending from the transistor portion 70 to the mesa portion 61 at the midway of the dummy trench region 60. By providing the accumulation region 16 extending from the transistor portion 70 to the dummy trench region 60, the effect on the accumulation region 16 formed in the transistor portion 70 becomes small even if there happens to be displacements in masks for forming the accumulation region 16. This can suppress the unevenness of a gate threshold voltage (Vth) and the unevenness of a saturation current. The outer end portion of the accumulation region 16 is shown by a broken line.

Figure 1H:
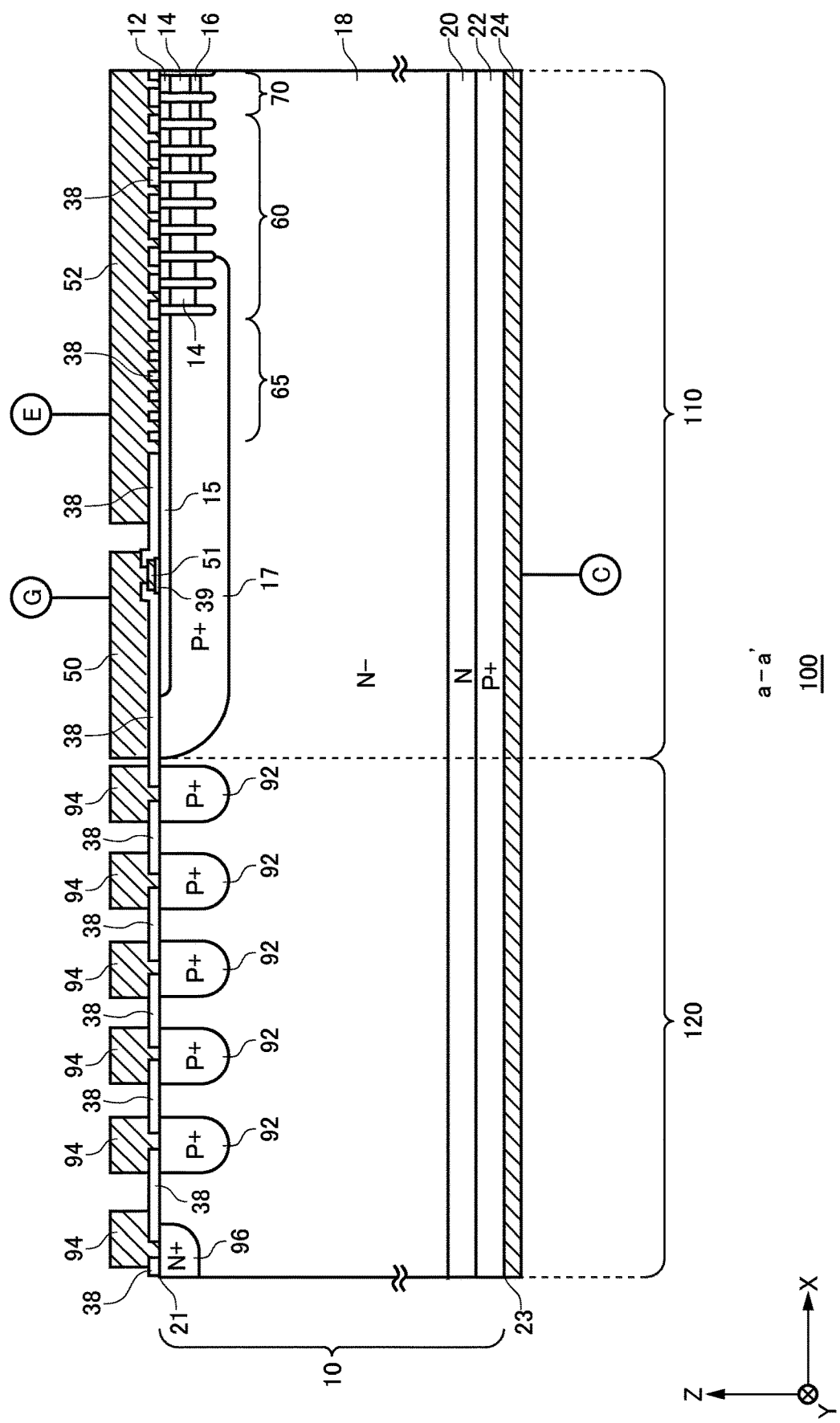
FIG. 1H is a diagram showing an example in the cross section a-a' of FIG. 1A.

FIG. 1H is a diagram showing an example in the cross section a-a' of FIG. 1A. In the present example, a sectional view of a region that overlaps the active region 110 and the outer peripheral region 120 is shown. The outer peripheral region 120 of the present example has a guard ring structure and a channel stopper structure.

A guard ring structure may include a plurality of guard ring portions 92. The guard ring structure of the present example includes five guard ring portions 92. Each guard ring portion 92 may be provided so as to surround the active region 110 and the pad region 130 in the front surface 21.

A guard ring structure may have a function of spreading a depletion layer generated in the active region 110 to outside of the semiconductor substrate 10. This can prevent an electric field strength inside the semiconductor substrate 10. Therefore, it is possible to improve the breakdown voltage of the semiconductor device 100, compared with the case where the guard ring structure is not provided.

The guard ring portion 92 is a semiconductor region of P+ type formed by ion implantation in the vicinity of the front surface 21. The guard ring portion 92 is electrically connected to the electrode layer 94. The electrode layer 94 may have the same material as the gate metal layer 50 or the emitter electrode 52.

A plurality of guard ring portions 92 are electrically insulated with each other by interlayer dielectric films 38. A depth of the bottom portion of the guard ring portion 92 may be the same depth as the bottom portion of the well region 17. The depth of the bottom portion of the guard ring portion 92 may be deeper than depths of the gate trench portion 40 and the dummy trench portion 30.

A channel stopper structure has a channel stopper region 96 and an electrode layer 94. The channel stopper region 96 is electrically connected to the electrode layer 94 via an opening of the interlayer dielectric film 38. The conductivity type of the channel stopper region 96 may be the first conductivity type, or the second conductivity type. The conductivity type of the channel stopper region 96 of the present example is of N+ type. The channel stopper region 96 has a function of terminating a depletion layer generated in the active region 110 at the outer end of the semiconductor substrate 10.

The well region 17 may go beyond the well-contact region 65 in the arrangement direction so as to further extend to the outside. The well region 17 of the present example may be provided so that the distance between the innermost guard ring portion 92 in the outer peripheral region 120 and the outer end of the well region 17 is close to each other. Moreover, as a modification of the present example, instead of the well region 17, the base region 14 may be provided by extending it to the vicinity of the innermost guard ring portion 92. Moreover, above the well region 17, an oxide film 39 may be provided between the contact region 15 and the gate runner 51. The oxide film 39 may be formed in the identical process as that of the dummy dielectric film 32 or the gate dielectric film 42. Alternatively, the oxide film 39 may be formed in a process such as field oxide with thicker film thickness.

Figure 2A:
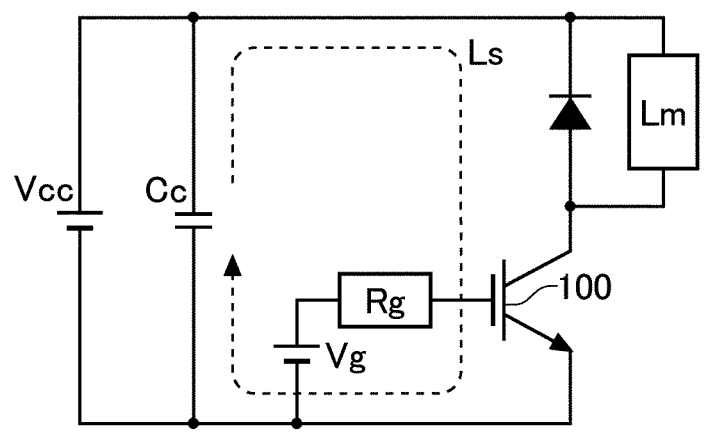
FIG. 2A is an example of a circuit upon a clamping overload tolerance test of the semiconductor device 100.

FIG. 2A is an example of a circuit upon a clamping overload tolerance test of the semiconductor device 100. A gate voltage Vg is imparted on a gate terminal of the semiconductor device 100 via predefined gate resistance Rg. In the clamping overload tolerance test, a rated current Ic is switched by a predefined power source voltage Vcc. The power source voltage Vcc may be approximately 60% of the rated voltage.

The float inductance Ls is a float inductance of a circuit to which the semiconductor device 100 is connected. Because the float inductance Ls is inclined to maintain the current, a voltage overshoot occurs when shutting down the current. By raising the float inductance Ls each switching from a predefined initial value, the semiconductor device 100 is turned off. When the float inductance Ls increases, a snap-off voltage ΔV increases. By increasing the float inductance Ls, the electric field intensity of the interior of the semiconductor device 100 increases so that an element is likely to be disrupted. Here, a result in a test that is one test before the test where the element is disrupted is set to be clamping energy (a breakdown withstand capability).

Figure 2B:
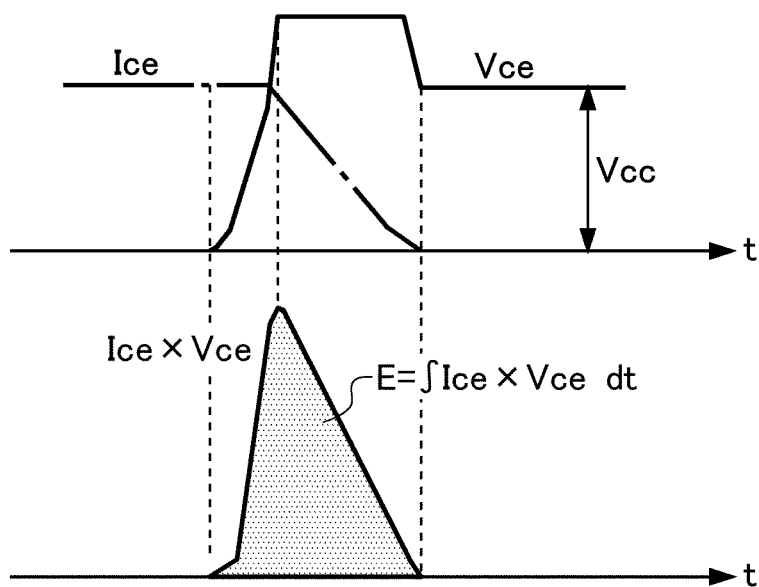
FIG. 2B is a diagram for describing clamping energy of the semiconductor device 100.

FIG. 2B is a diagram for describing clamping energy of the semiconductor device 100. This figure shows movements of the collector-emitter current Ice at turn-off and the collector-emitter voltage Vce. The graph of the present example shows a waveform immediately prior to the waveform of the float inductance Ls in which an element is disrupted after repeating turn-offs while increasing float inductance Ls in a clamping overload tolerance test. By a turn-off of the semiconductor device 100, a collector-emitter voltage Vce snaps off and the voltage is kept constant for a certain period of time. The period of time when the voltage is constant is a clamp period.

Clamping energy is an integral value where a current multiplied by a voltage is in the range of 0 or more in the period of time until when the voltage settles from a snap-off of a collector-emitter voltage Vce into a power source voltage Vcc. That is, clamping energy is indicated by an integral value of ∫Ice×Vce dt (i.e., energy value). The greater clamping energy indicates the greater breakdown withstand capability at turn-off.

Figure 3A:
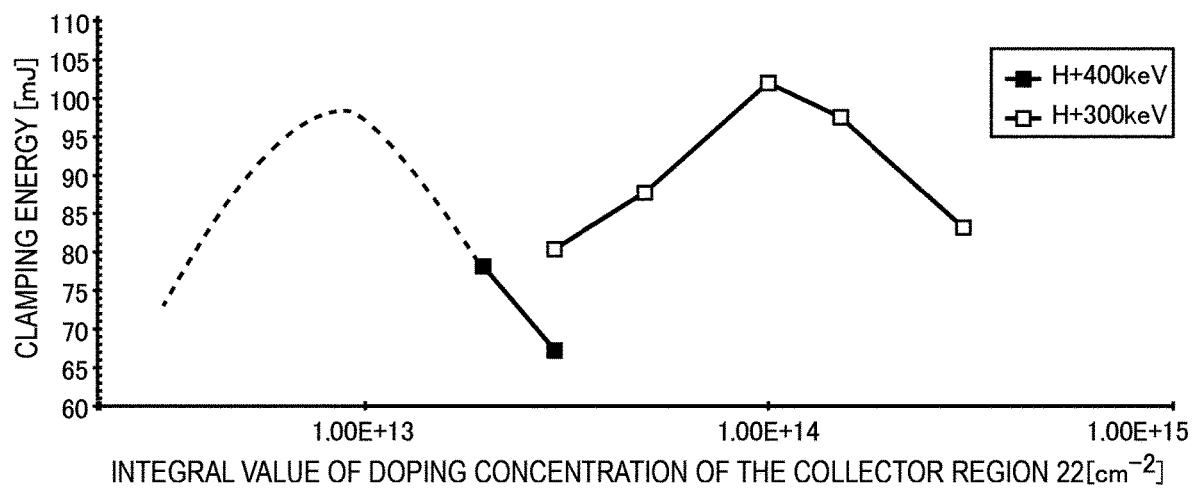
FIG. 3A shows a relation between the doping concentration of the collector region 22 and clamping energy.

FIG. 3A shows a relation between the doping concentration of the collector region 22 and clamping energy. The vertical axis indicates clamping energy [mJ] and the horizontal axis indicates an integral value that integrated the doping concentration of the collector region 22 over the depth from the back surface 23 to the PN junction between the collector region 22 and the field stop region 20 [$cm^{-2}$] (hereinafter, referred to as the integral value of the doping concentration of the collector region 22). A black square indicates the case where the acceleration energy of proton is 400 keV. A white square indicates the case where the acceleration energy of proton is 300 keV. Proton is one kind of hydrogen ions. Hydrogen donor is formed, for example, by the ion implantation of proton into a semiconductor substrate.

The smaller the acceleration energy of proton is, the smaller the total dosage of proton becomes, thereby clamping energy becomes more inclined to rise. Also, when the total dosage of proton is small, concentration of holes injected from the back surface 23 at an avalanche breakdown increases, thereby an avalanche breakdown tends to be generated on the side of active region 110. In this manner, when the clamping breakdown voltage of active region 110 falls lower than the clamping breakdown voltage of the outer peripheral region 120, the instant destruction in the outer peripheral region 120 becomes easier to prevent, as described below. Instant destruction is, for example, a destruction of an element before a current is shut down at turn-off.

For example, if the acceleration energy of proton is 300 keV, the integral value of doping concentration of the collector region 22 is approximately 1.00E+14 [$cm^{-2}$], which results in the maximum value of clamping energy. In this case, for example, the proton range of the first peak P1 becomes 3.13 μm. Moreover, 1.00E+14 [$cm^{-2}$] indicates $1.00 \times 10^{14}$ [$cm^{-2}$].

Also, if the acceleration energy of proton is 400 keV, the integral value of doping concentration of the collector region 22 is approximately 1.00E+13 [$cm^{-2}$], which results in the maximum value of clamping energy. In this case, for example, the proton range becomes 4.52 μm.

Moreover, the integral value of doping concentration of the collector region 22 is substantially equal to the implanted dosage of back surface boron, and thus the implanted dosage may be set to be the integral value of doping concentration of the collector region 22.

The semiconductor device 100 of the present example makes the clamping breakdown voltage of the active region 110 smaller than the clamping breakdown voltage of the outer peripheral region 120 by controlling the integral concentration of the collector region 22 and the peak depth of the field stop region 20. This allows the clamping energy of the semiconductor device 100 to improve.

Figure 3B:
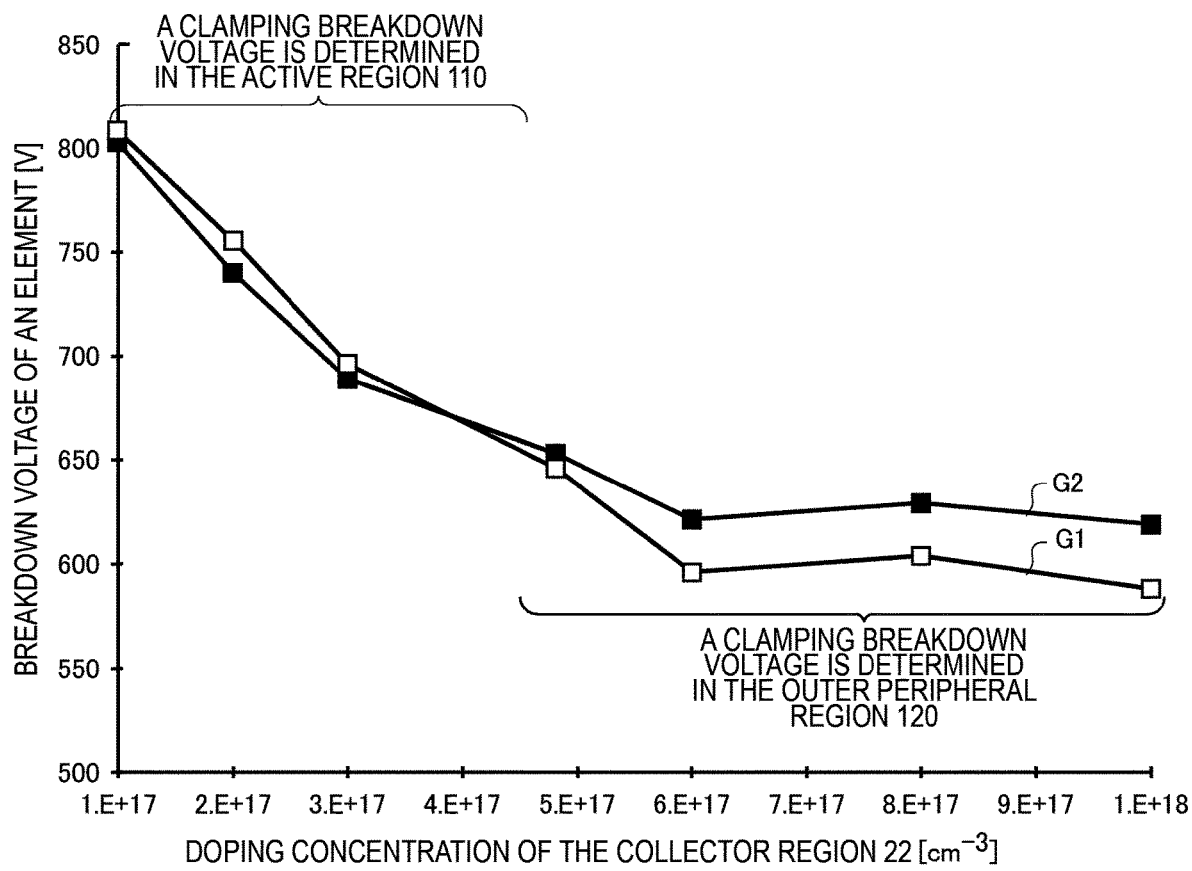
FIG. 3B shows a relation between the doping concentration of the collector region 22 and the breakdown voltage of an element.

FIG. 3B shows a relation between the doping concentration of the collector region 22 and the breakdown voltage of an element. The vertical axis indicates the breakdown voltage of an element, and the horizontal axis indicates the doping concentration of the collector region 22 [$cm^{-3}$]. The collector region 22 includes a doping concentration distribution with peaks. In this case, the doping concentration of the collector region 22 may be a Peak value of the doping concentration of the collector region 22. In the present example, a case where the field stop region 20 has four peaks is described.

The graph G1 indicates the active model and edge model when the field stop region 20 has four peaks. The active model and edge model is a simulation model that accounts for both the active region 110 and the outer peripheral region 120. The graph G2 indicates the active model when the field stop region 20 has four peaks. The active model is a simulation model that does not account for the outer peripheral region 120 but accounts only for the active region 110.

By decreasing the doping concentration of the collector region 22, the breakdown voltage of the active region 110 falls lower than the breakdown voltage of the outer peripheral region 120. That is, the breakdown voltage of an element becomes the breakdown voltage of the active region 110. In this manner, when the breakdown voltage of an element starts to be determined in the active region 110, clamping energy increases.

On the other hand, by increasing the doping concentration of the collector region 22, the breakdown voltage of the active region 110 increases greater than the breakdown voltage of the outer peripheral region 120. That is, the breakdown voltage of an element becomes the breakdown voltage of the outer peripheral region 120. In this manner, when the breakdown voltage of an element starts to be determined in the outer peripheral region 120, clamping energy falls. Accordingly, in order to raise clamping energy, the doping concentration of the collector region 22 may be $6 \times 10^{17}$ (/cm$^3$) or less, or may be $5 \times 10^{17}$ (/cm$^3$) or less.

Figure 4A:
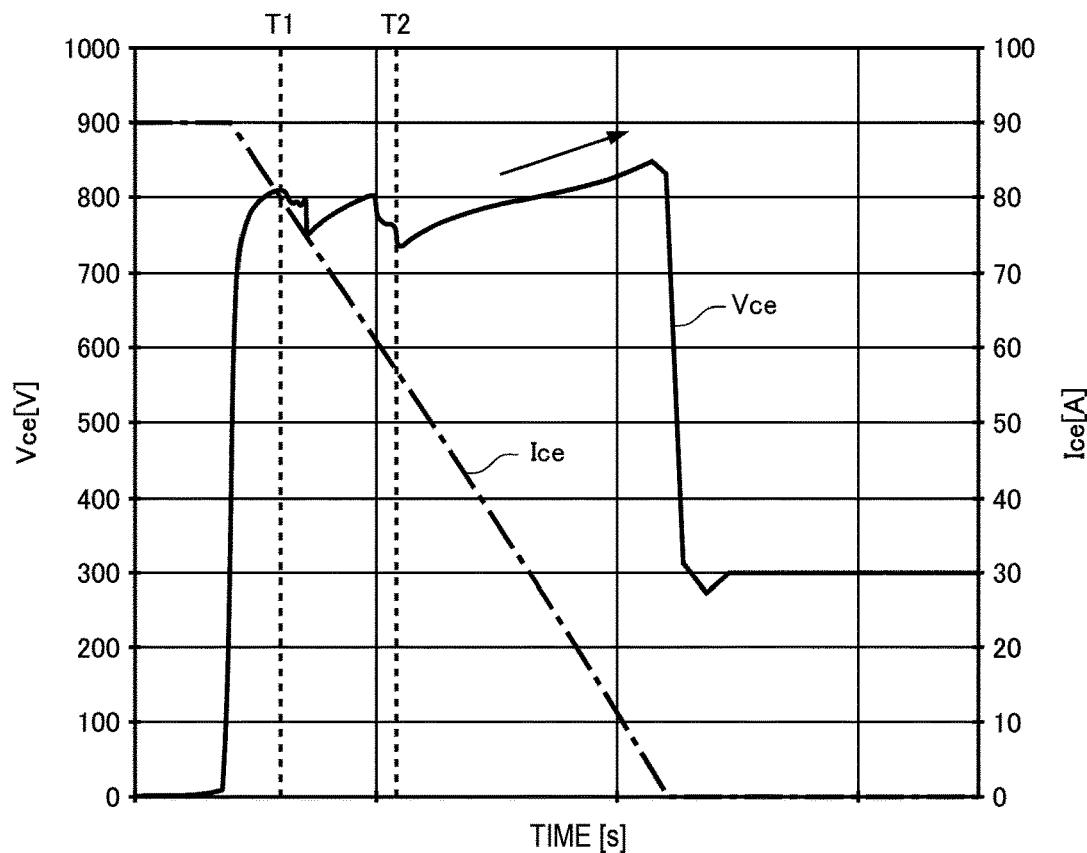
FIG. 4A shows an example of the current/voltage characteristic of the semiconductor device 100 according to the embodiment example.
Figure 4A:
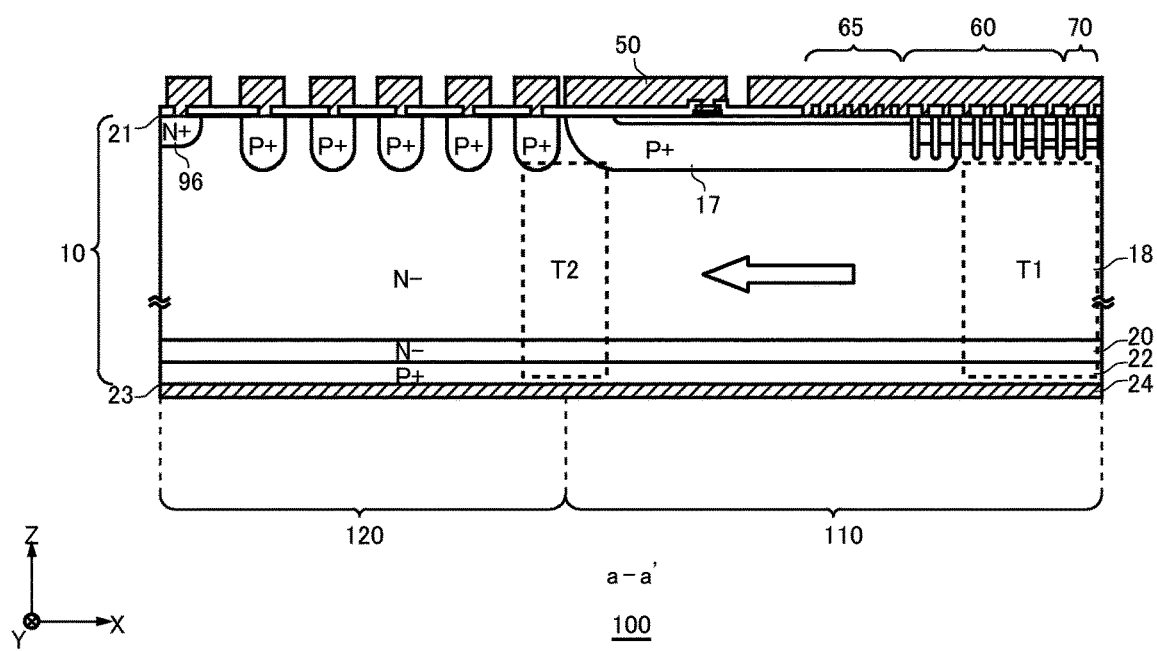

FIG. 4A shows an example of the current/voltage characteristic of the semiconductor device 100 according to the embodiment example. The vertical axis indicates a collector-emitter current Ice [A] and a collector-emitter voltage Vce [V], and the horizontal axis indicates time [s]. Also, in a sectional view of the semiconductor device 100, regions where electron current density is high are indicated by broken lines at the time T1 and the time T2 respectively. The doping concentration of the collector region 22 of the present example, in FIG. 3B, is set to be within a range where the clamping breakdown voltage is determined in the active region 110.

Time T1 is a time when the semiconductor device 100 turns off raising a collector-emitter voltage Vce. At the time T1, electron current is concentrated in the region indicated by the broken line of the active region 110. That is, a part of the region indicated by the broken line of the active region 110 forms the peak regions of electron current density.

Time T2 indicates a time when a collector-emitter voltage Vce rises and is clamped around 800V. At the time T2, the temperature of a part where the avalanche breakdown occurs rises. Raised temperature intensifies lattice vibration, scattering electrons. If a current becomes less easy to flow due to the scattering of electrons, the peak regions of electron current density may move from the active region 110 toward an end portion of the side of the outer peripheral region 120 of the well region 17.

In this manner, if the breakdown voltage of the active region 110 is smaller than the breakdown voltage of the outer peripheral region 120, the peak regions of electron current density formed on the side of the active region 110 move to the side of the outer peripheral region 120. This temporarily lowers the temperature of the active region 110. Also, if the peak regions of electron current density by an avalanche breakdown move to the side of the outer peripheral region 120, power (that is, Ice×Vce) falls. Accordingly, the raised temperature of the semiconductor device 100 can be reduced so as to prevent instant destruction.

Figure 4B:
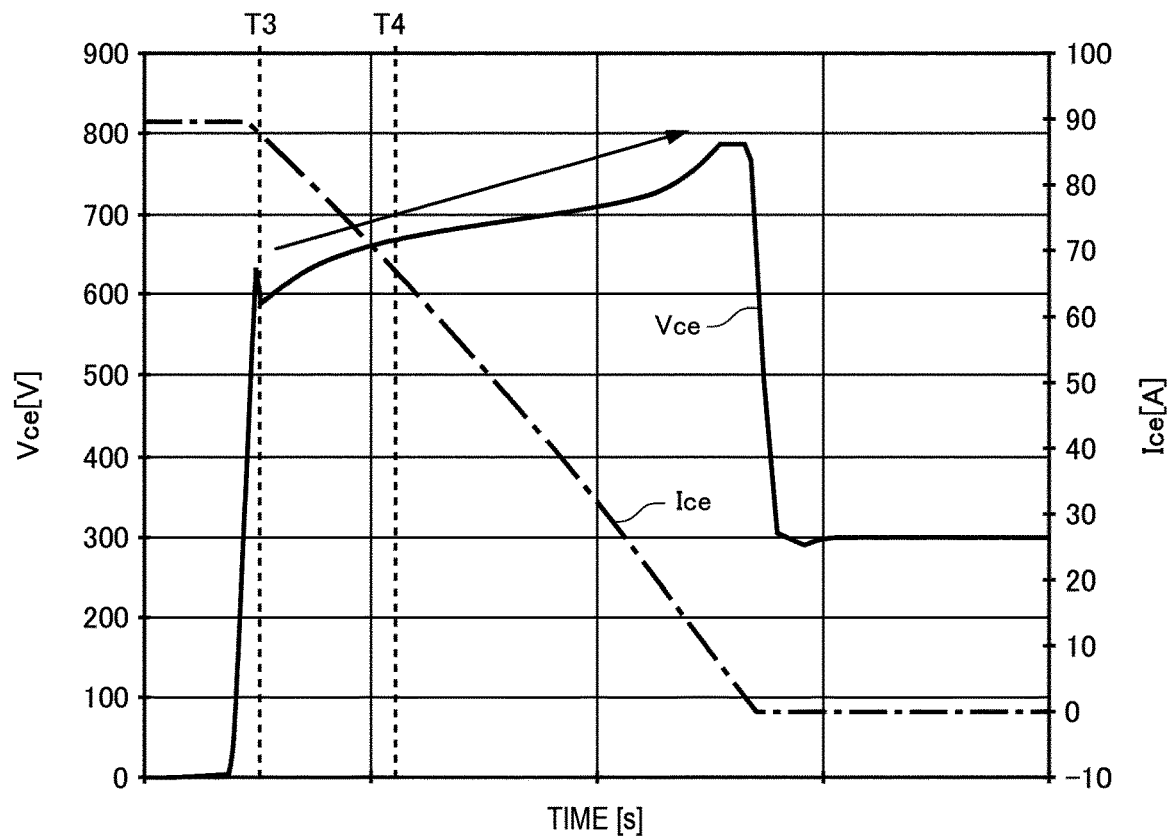
FIG. 4B shows an example of the current/voltage characteristic of the semiconductor device 500 according to the comparative example.
Figure 4B:
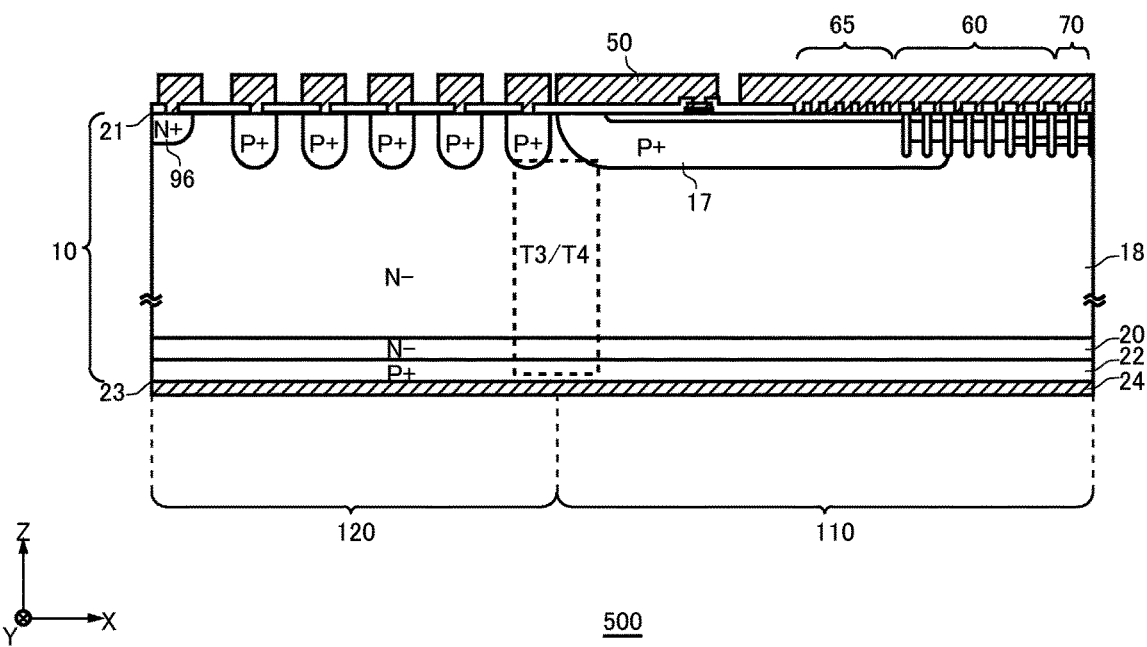

FIG. 4B shows an example of the current/voltage characteristic of the semiconductor device 500 according to the comparative example. The vertical axis indicates a collector-emitter current Ice [A] and a collector-emitter voltage Vce [V], and the horizontal axis indicates time [s]. Also, in the present example, the peak regions of electron current density are indicated by broken lines at the time T3 and the time T4 respectively. The doping concentration of the collector region 22 of the present example, in FIG. 3B, is set to be within a range where the clamping breakdown voltage is determined in the outer peripheral region 120.

The semiconductor device 500 has the integral concentration of the collector region 22 set so that the breakdown voltage of the outer peripheral region 120 is smaller than the breakdown voltage of the active region 110. Turn-offs cause an avalanche breakdown to occur on the side of the outer peripheral region 120 of the well region 17, forming the peak regions of electron current density in the part indicated by the broken line. From time T3 to time T4, power is high, and the peak regions of electron current density remain in the position indicated by the broken line. Therefore, a current crowding causes the temperature to continue to rise. In this manner, in the semiconductor device 500, an element becomes easier to be disrupted, and the clamping overload cannot improve.

In the outer peripheral region 120, an avalanche breakdown tends to occur because carriers tend to concentrate in a contact hole edge of the side of the outer peripheral region 120 in addition to the amplified avalanche breakdown according to the hole injection efficiency of the collector region 22. A rise in concentration of holes on the side of the back surface 23 amplifies an avalanche breakdown at clamping.

The semiconductor device 100 of the present example decreases the hole injection efficiency of the collector region 22 by setting the depth of the first peak P1 of the doping concentration of the collector region 22 at an appropriate depth, so as to make the clamping breakdown voltage of the active region 110 smaller than the clamping breakdown voltage of the outer peripheral region 120. This allows an instant destruction to be suppressed because an avalanche breakdown moves to the outer peripheral region 120 after an avalanche breakdown occurred in the active region 110. The doping concentration of the collector region 22 and the depth of the first peak P1 may be set so that clamping energy becomes maximum. An appropriate range of the doping concentration of the collector region 22 and the depth of the first peak P1 will be described below.

Moreover, if it is designed to have a breakdown voltage greater than the voltage overshoot (which is a peak value of voltage) estimated for preventing element destruction when shutting down a current, it is required to increase the thickness in the depth direction of the semiconductor substrate 10 or to increase the area of the outer peripheral region 120. In order to reduce the chip cost, the breakdown voltage of an element may be designed to be a voltage overshoot or less. The semiconductor device 100 of the present example allows element destruction to be prevented while reducing the chip cost, by causing an avalanche breakdown to occur in the active region 110 at turn-off.

Also, the total dosage of the field stop region 20 and the total dosage of the collector region 22 may be determined so that the breakdown voltage of the active region 110 becomes smaller than the breakdown voltage of the outer peripheral region 120. For example, the total dosage of the field stop region 20 may be 10-fold or less of the total dosage of the collector region 22, or may be 5-fold or less of the total dosage of the collector region 22.

Figure 5A:
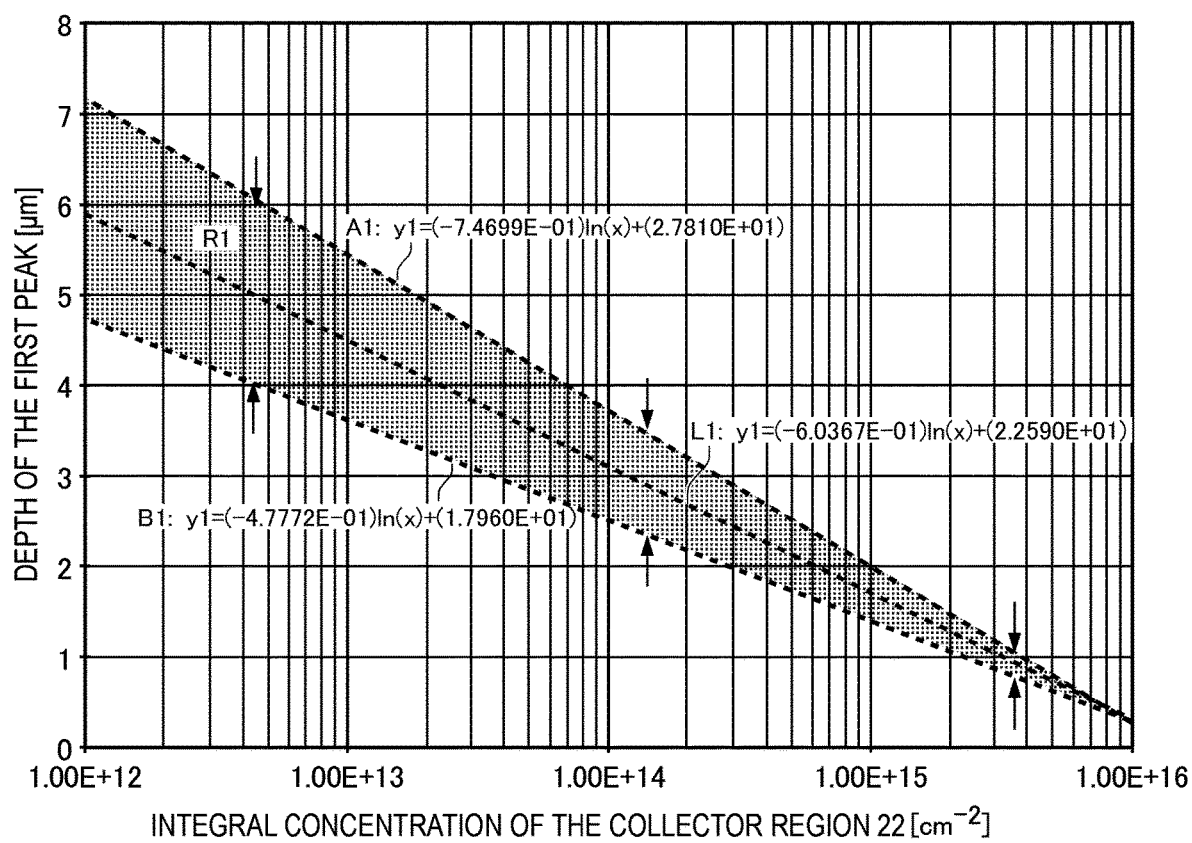
FIG. 5A shows a relation between the integral concentration of the collector region 22 and the depth of a first peak P1.

FIG. 5A shows another example of a relation between the integral concentration of the collector region 22 and the depth of the first peak P1. The vertical axis indicates the depth of the first peak P1, y1 [μm], and the horizontal axis indicates the integral concentration of the collector region 22, x [cm$^{-2}$].

Here, the following base line L1 is calculated based on the acceleration energy in the shallowest part of proton obtained in FIG. 3A and the data at the two points where clamping energy becomes maximum.

Base line $L1$: $y1=(-6.0367E-01)\ln(x)+(2.2590E+01)$

That is, the base line L1 indicates a relation between the integral concentration of the collector region 22 in which clamping energy becomes maximum and the depth of the first peak P1 in which clamping energy becomes maximum.

Region R1 indicates the region within the range of ±15% of the base line L1. The region R1 of the present example is a region between the line A1 and the line B1. The line A1 and the line B1 of the present example are represented by the following equation.

Line $A1$: $y1=(-7.4699E-01)\ln(x)+(2.7810E+01)$

Line $B1$: $y1=(-4.7772E-01)\ln(x)+(1.7960E+01)$

In this case, the depth of the first peak P1 and the integral concentration of the collector region 22 belong to the region R1. If in the region R1, the hole injection efficiency of the collector region 22 can be suppressed so as to make the clamping breakdown voltage of the outer peripheral region 120 smaller than the clamping breakdown voltage of the active region 110. The integral concentration of the collector region 22 may be 1.00E16 cm$^{-2}$ or less, or may be 8.00E15 cm$^{-2}$ or less. The depth of the first peak P1 may be 0.5 μm or more and 7.2 μm or less.

The semiconductor device 100 of the present example can cause an avalanche breakdown at clamping to occur on the side of the active region 110, by setting the integral concentration of the collector region 22 and the depth of the first peak P1 to be in the region R1. This improves a clamping breakdown voltage.

Figure 5B:
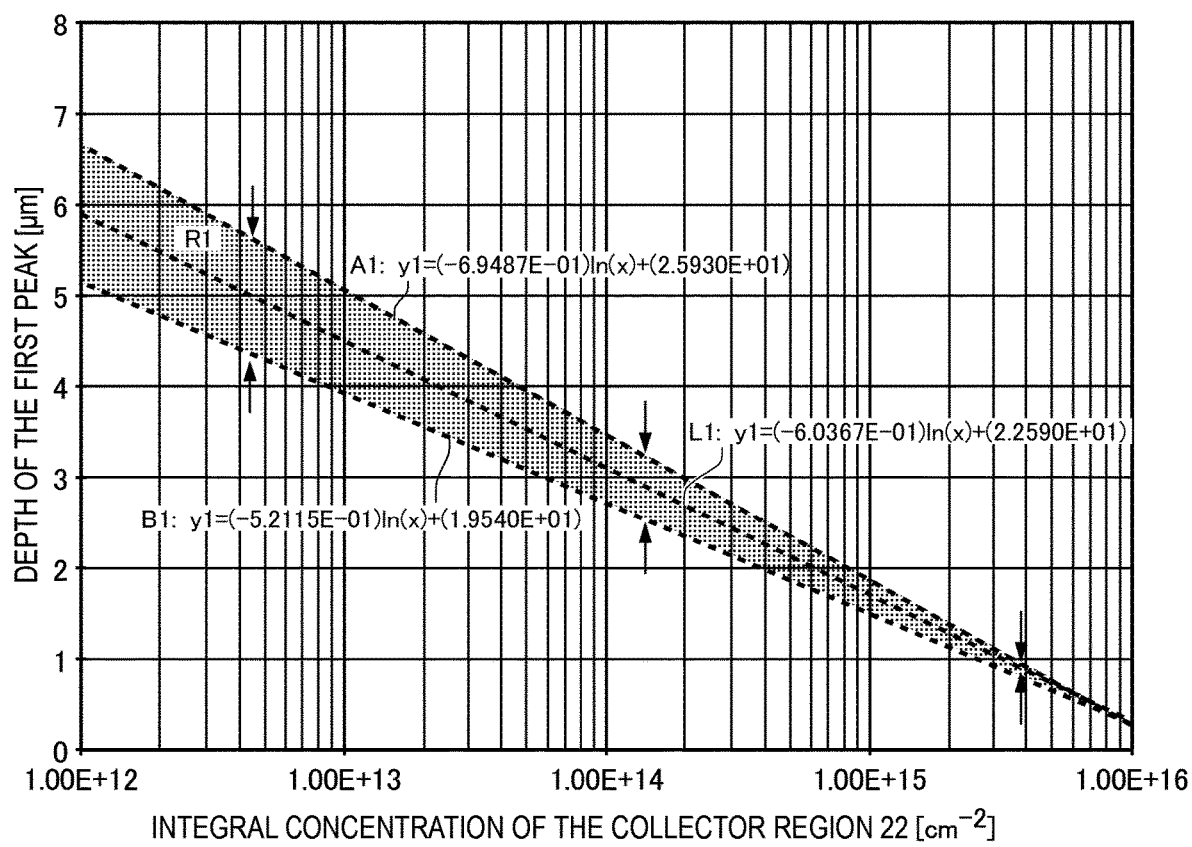
FIG. 5B shows another example of a relation between the integral concentration of the collector region 22 and the depth of the first peak P1.

FIG. 5B shows another example of a relation between the integral concentration of the collector region 22 and the depth of the first peak P1. The region R1 of the present example indicates a region corresponding to ±10% of the base line L1.

The base line L1 is identical to the base line L1 in FIG. 5A. The line A1 and the line B1 of the present example are represented by the following equation.

Line $A1$: $y1=(-6.9487E-01)\ln(x)+(2.5930E+01)$

Line $B1$: $y1=(-5.2115E-01)\ln(x)+(1.9540E+01)$

Similarly, in this case, the depth of the first peak P1 and the integral concentration of the collector region 22 may be set to belong to the region R1.

Figure 5C:
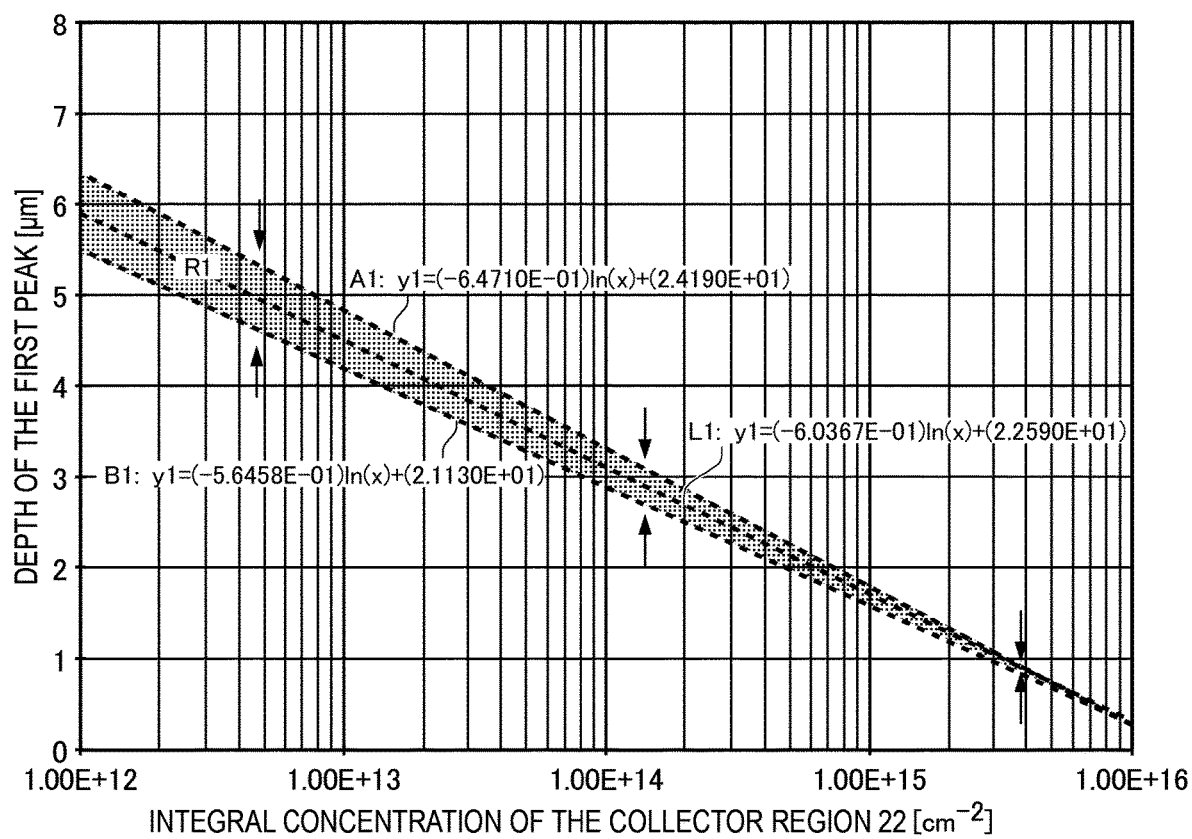
FIG. 5C shows another example of a relation between the integral concentration of the collector region 22 and the depth of the first peak P1.

FIG. 5C shows another example of a relation between the integral concentration of the collector region 22 and the depth of the first peak P1. The region R1 of the present example indicates a region corresponding to ±5% of the base line L1.

The base line L1 is identical to the base line L1 in FIG. 5A. The line A1 and the line B1 of the present example are represented by the following equation.

Line $A1$: $y1=(-6.4710E-01)\ln(x)+(2.4190E+01)$

Line $B1$: $y1=(-5.6458E-01)\ln(x)+(2.1130E+01)$

Similarly, in this case, the depth of the first peak P1 and the integral concentration of the collector region 22 may be set to belong to the region R1 of the present example.

Figure 6A:
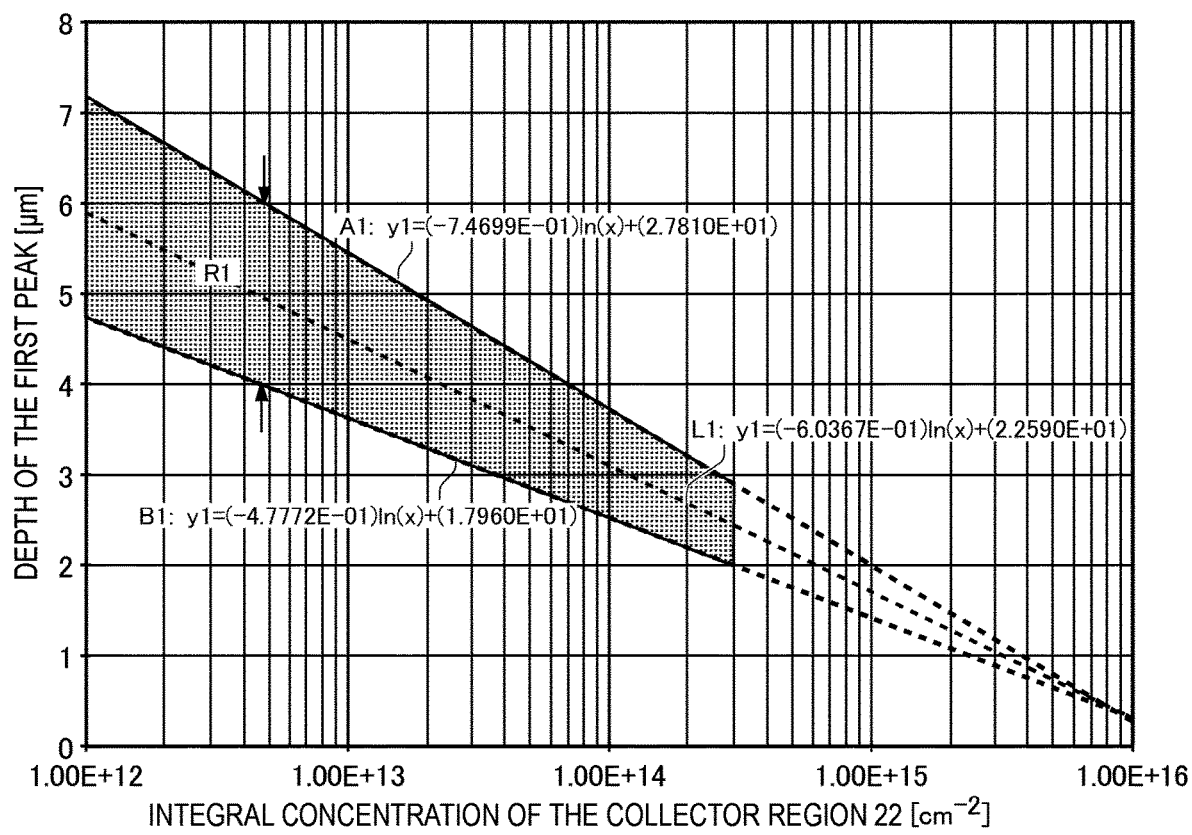
FIG. 6A shows another example of a relation between the integral concentration of the collector region 22 and the depth of the first peak P1.

FIG. 6A shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 3.00E14 cm$^{-2}$ or less. The depth of the first peak P1 may be 2.0 μm or more and 7.2 μm or less. The depth of the first peak P1 and the integral concentration of the collector region 22 may be set to belong to the region R1 of the present example.

Figure 6B:
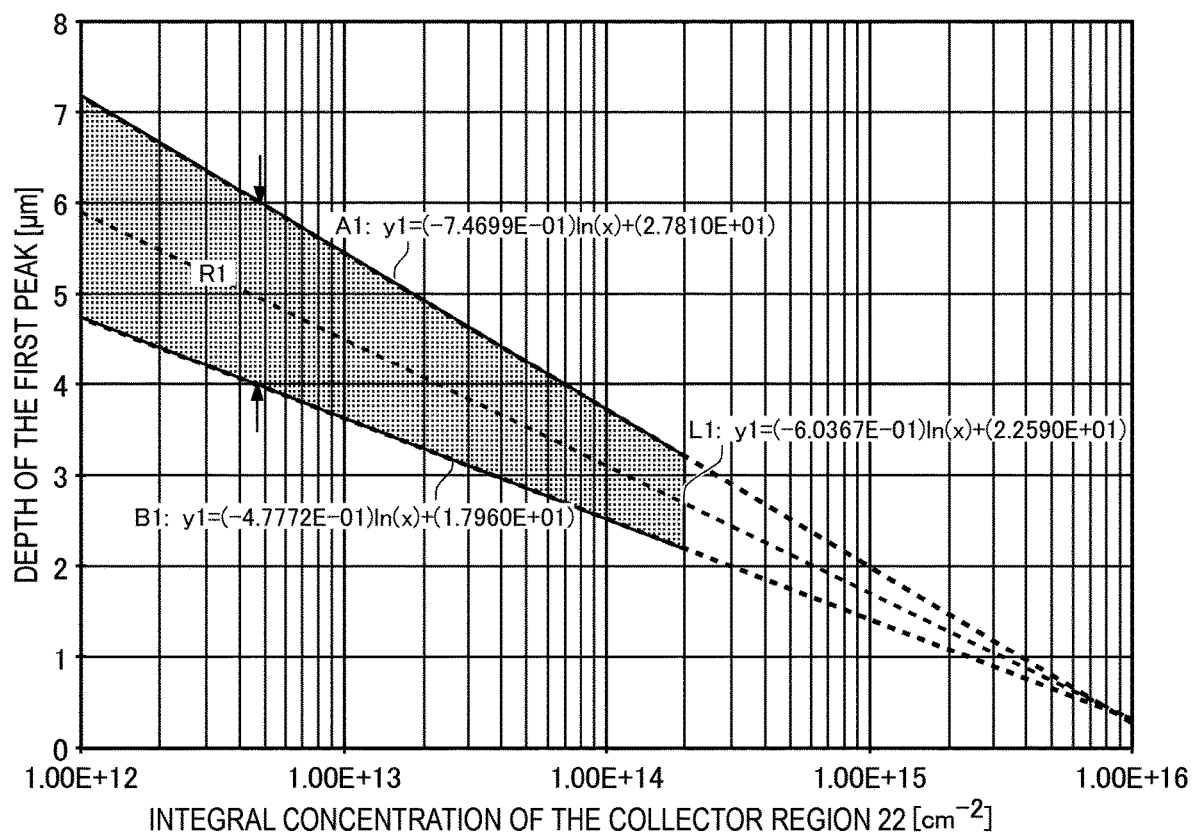
FIG. 6B shows another example of a relation between the integral concentration of the collector region 22 and the depth of the first peak P1.

FIG. 6B shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 2.00E14 cm$^{-2}$ or less. The depth of the first peak P1 may be 2.2 μm or more and 7.2 μm or less. The depth of the first peak P1 and the integral concentration of the collector region 22 may be set to belong to the region R1 of the present example.

Figure 6C:
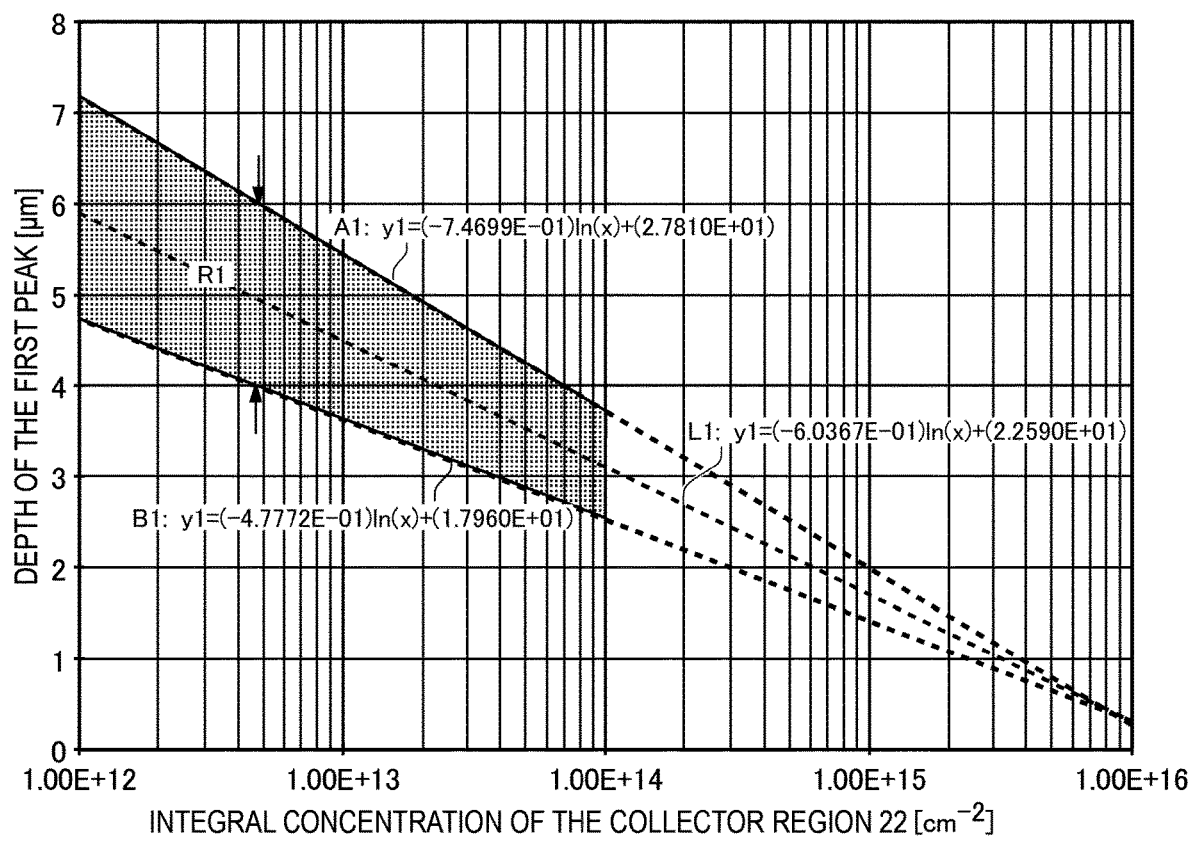
FIG. 6C shows another example of a relation between the integral concentration of the collector region 22 and the depth of the first peak P1.

FIG. 6C shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 1.00E14 cm$^{-2}$ or less. The depth of the first peak P1 may be 2.5 μm or more and 7.2 μm or less. The depth of the first peak P1 and the integral concentration of the collector region 22 may be set to belong to the region R1 of the present example.

Figure 6D:
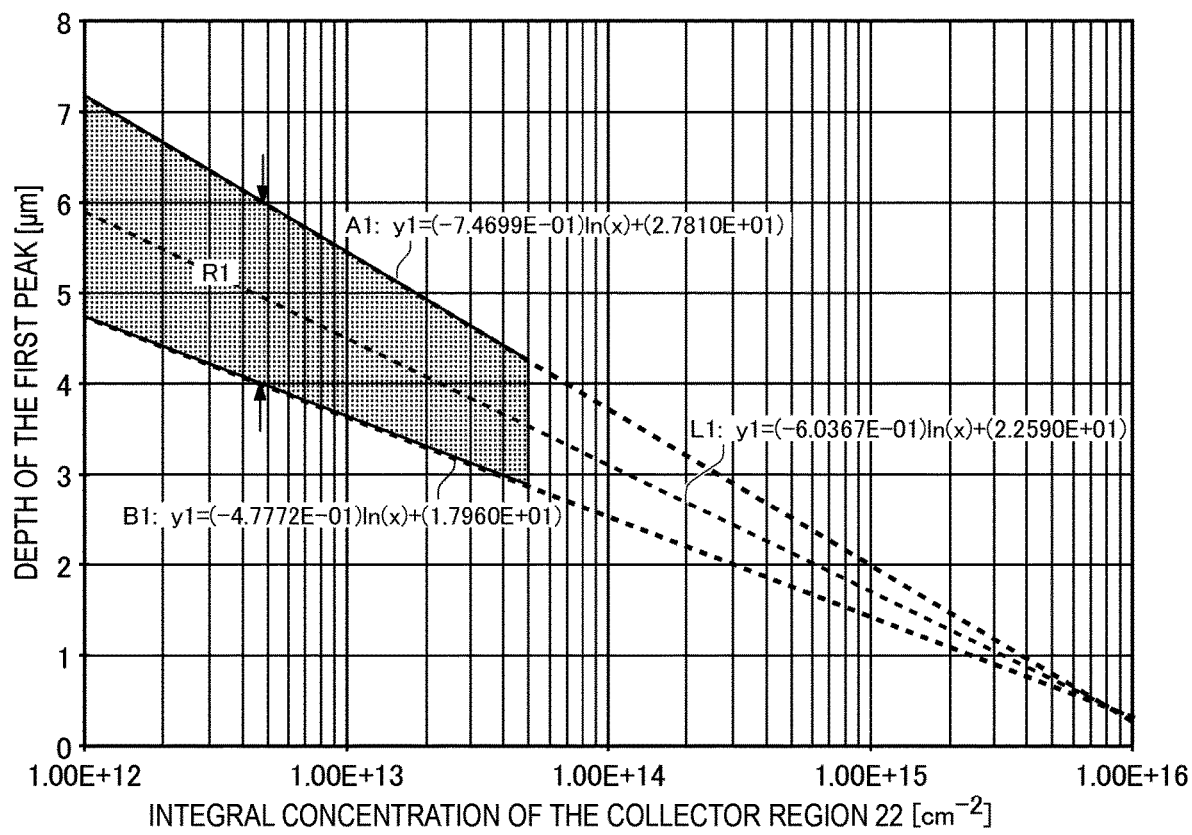
FIG. 6D shows another example of a relation between the integral concentration of the collector region 22 and the depth of the first peak P1.

FIG. 6D shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 5.00E13 cm$^{-2}$ or less. The depth of the first peak P1 may be 3.0 μm or more and 7.2 μm or less. The depth of the first peak P1 and the integral concentration of the collector region 22 may be set to belong to the region R1 of the present example.

Figure 6E:
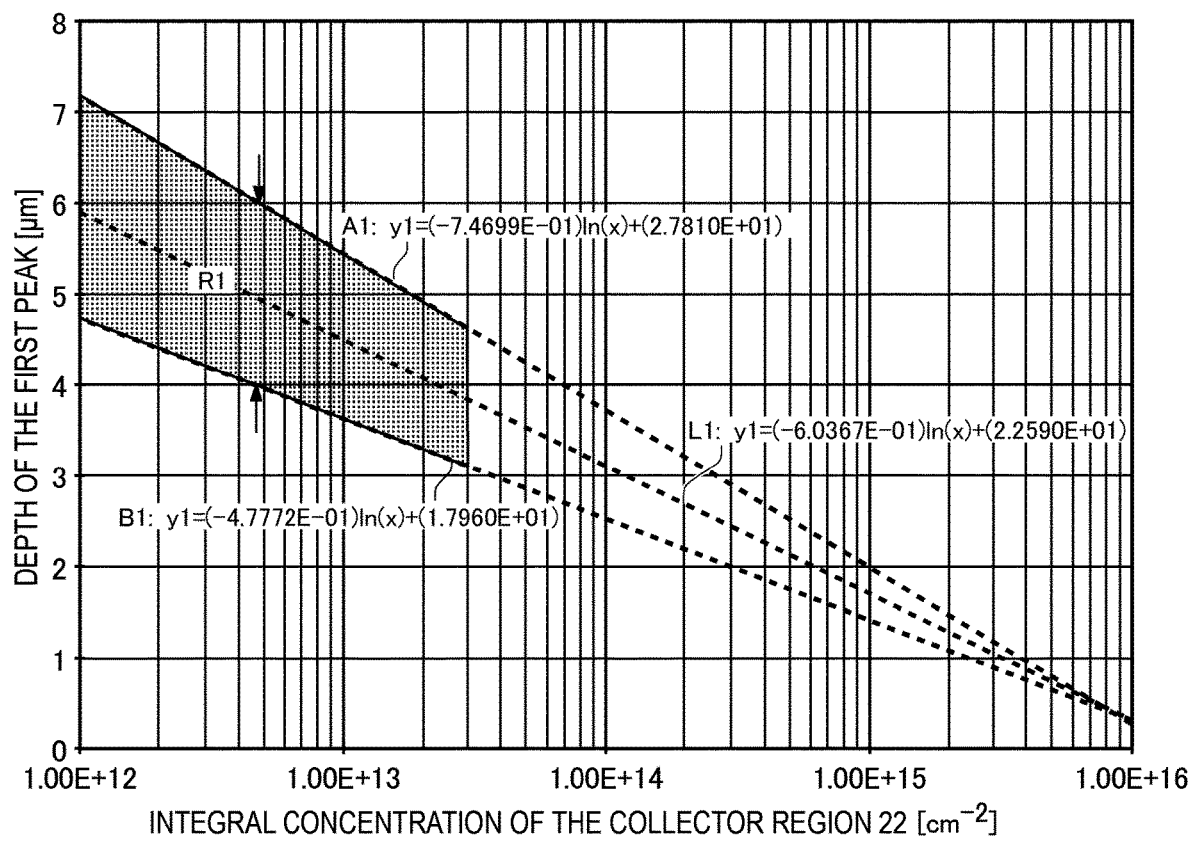
FIG. 6E shows another example of a relation between the integral concentration of the collector region 22 and the depth of the first peak P1.

FIG. 6E shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 3.00E13 cm$^{-2}$ or less. The depth of the first peak P1 may be 3.2 μm or more and 7.2 μm or less. The depth of the first peak P1 and the integral concentration of the collector region 22 may be set to belong to the region R1 of the present example.

Figure 6F:
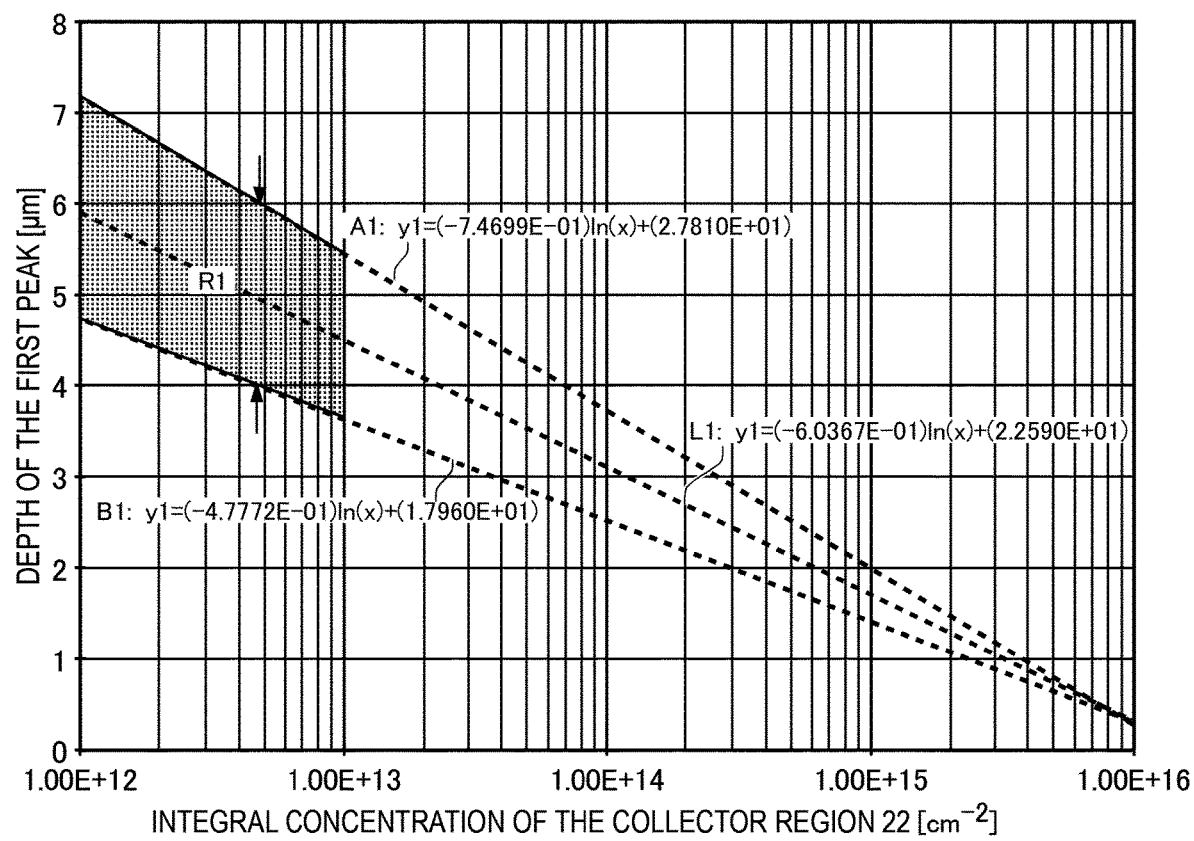
FIG. 6F shows another example of a relation between the integral concentration of the collector region 22 and the depth of the first peak P1.

FIG. 6F shows another example of a relation between the integral concentration of the collector region 22 and the depth of the first peak P1. The base line L1, the line A, and the line B are identical to each line in FIG. 5A. That is, it indicates a region corresponding to ±15% of the base line L1. However, the region R1 of the present example indicates a region where the integral concentration of the collector region 22 is 1.00E13 cm$^{-2}$ or less. The depth of the first peak P1 may be 3.6 μm or more and 7.2 μm or less. The depth of the first peak P1 and the integral concentration of the collector region 22 may be set to belong to the region R1 of the present example.

Moreover, also for FIG. 5B and FIG. 5C, the range of an integral concentration of the collector region 22 may be restricted similarly to FIG. 6A to FIG. 6F. For example, in FIG. 5B and FIG. 5C, the region R1 may be a region with the integral concentration of the collector region 22 of 1.00E14 cm$^{-2}$ or less, a region with that of the 5.00E13 cm$^{-2}$ or less, a region with that of 3.00E13 cm$^{-2}$ or less, or a region with that of 1.00E13 cm$^{-2}$ or less.

Figure 7A:
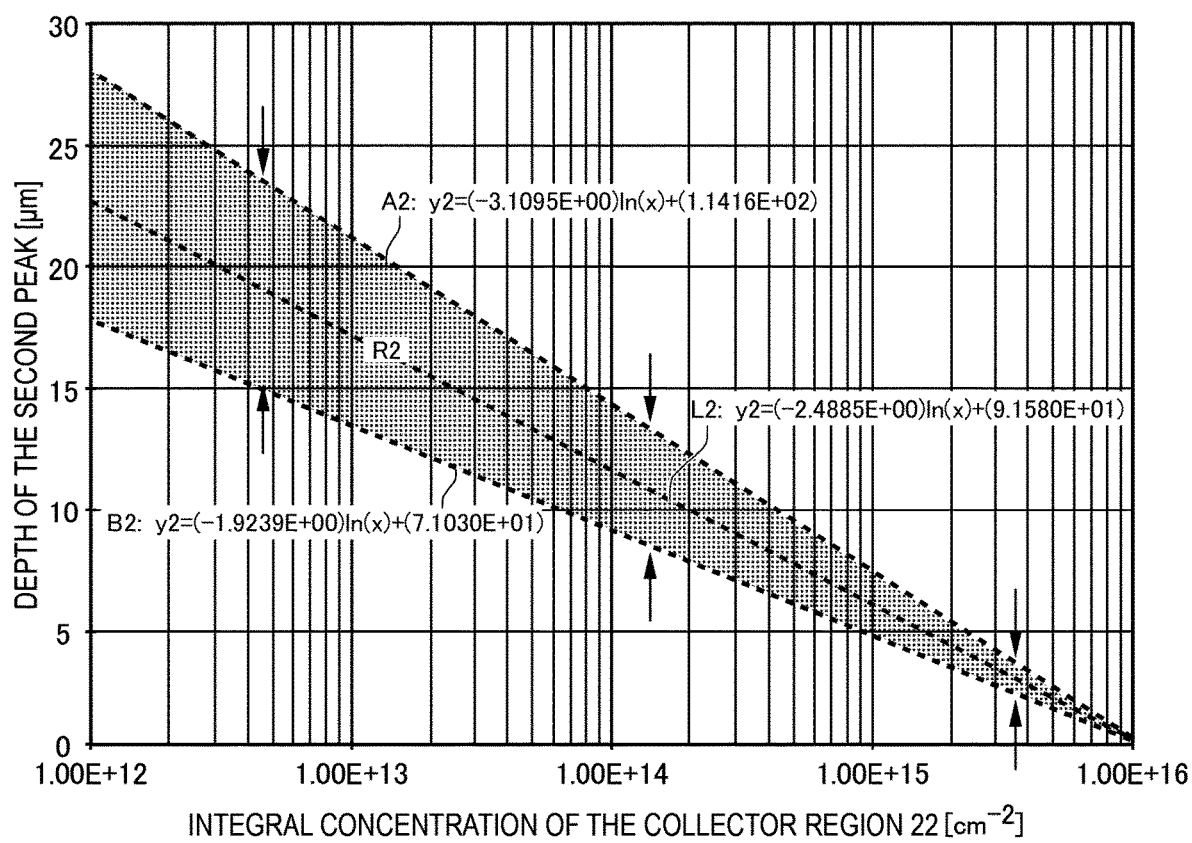
FIG. 7A shows another example of a relation between the integral concentration of the collector region 22 and the depth of a second peak P2.

FIG. 7A shows another example of a relation between the integral concentration of the collector region 22 and the depth of a second peak P2. The vertical axis indicates the depth of the second peak P2, y2 [μm], and the horizontal axis indicates the integral concentration of the collector region 22, x [cm$^{-2}$].

Here, the following base line L2 is calculated based on the acceleration energy in the shallowest part of proton obtained in FIG. 3A and the data at the two points where clamping energy becomes maximum.

Base line $L2: y2=(-2.4885E+00)\ln(x)+(9.1580E+01)$

That is, the base line L2 indicates a relation between the integral concentration of the collector region 22 in which clamping energy becomes maximum and the depth of the second peak P2 in which clamping energy becomes maximum.

Region R2 indicates the region within the range of ±15% of the base line L2. The region R2 of the present example is a region between the line A2 and the line B2. The line A2 and the line B2 of the present example are represented by the following equation.

Line $A2: y2=(-3.1095E+00)\ln(x)+(1.1416E+02)$

Line $B2: y2=(-1.9239E+00)\ln(x)+(7.1030E+01)$

In this case, the depth of the second peak P2 and the integral concentration of the collector region 22 belong to the region R2. If in the region R2, clamping energy becomes sufficiently high. The depth of the second peak P2 may be 3.5 μm or more and 28 μm or less.

Figure 7B:
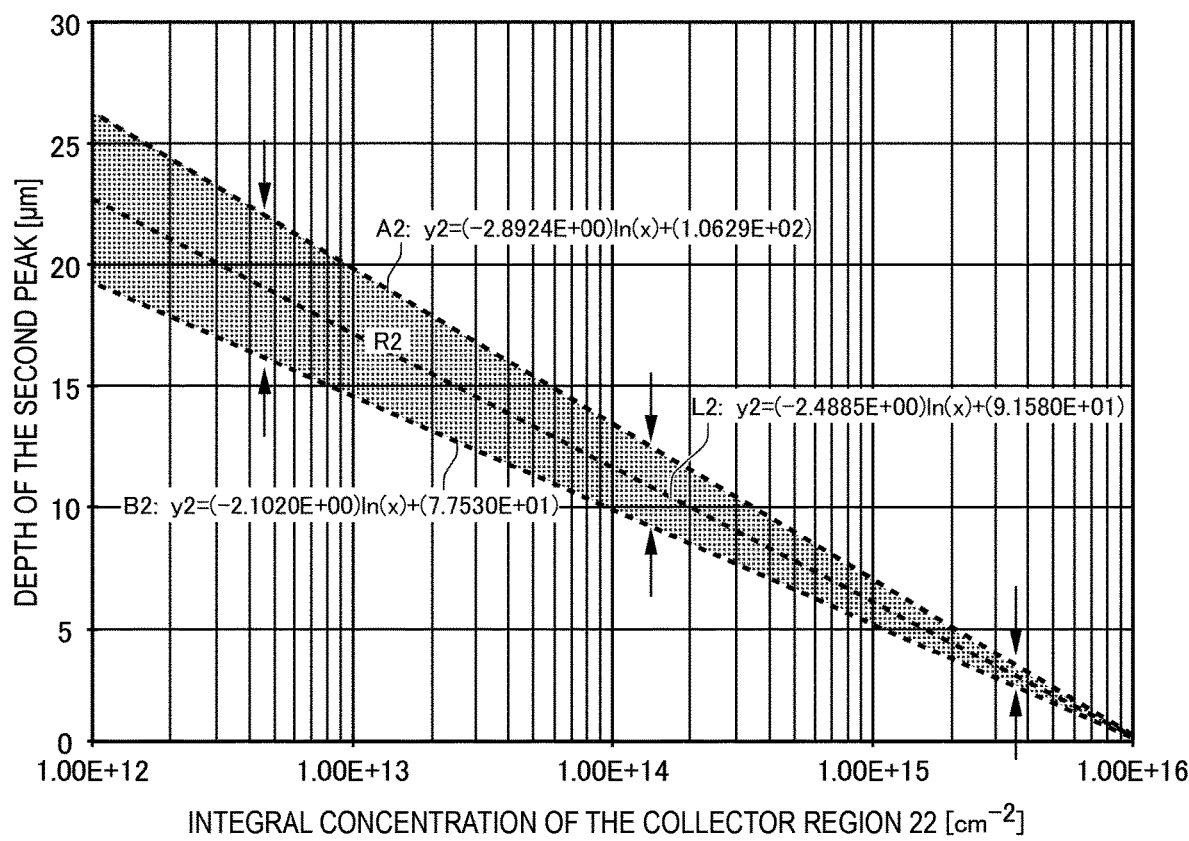
FIG. 7B shows another example of a relation between the integral concentration of the collector region 22 and the depth of the second peak P2.

FIG. 7B shows another example of a relation between the integral concentration of the collector region 22 and the depth of the second peak P2. The region R2 of the present example indicates a region corresponding to ±10% of the base line L2.

The base line L2 is identical to the base line L2 in FIG. 7A. The line A2 and the line B2 of the present example are represented by the following equation.

Line $A2: y2=(-2.8924E+00)\ln(x)+(1.0629E+02)$

Line $B2: y2=(-2.1020E+00)\ln(x)+(7.7530E+01)$

Similarly, in this case, the depth of the second peak P2 and the integral concentration of the collector region 22 may be set to belong to the region R2.

Figure 7C:
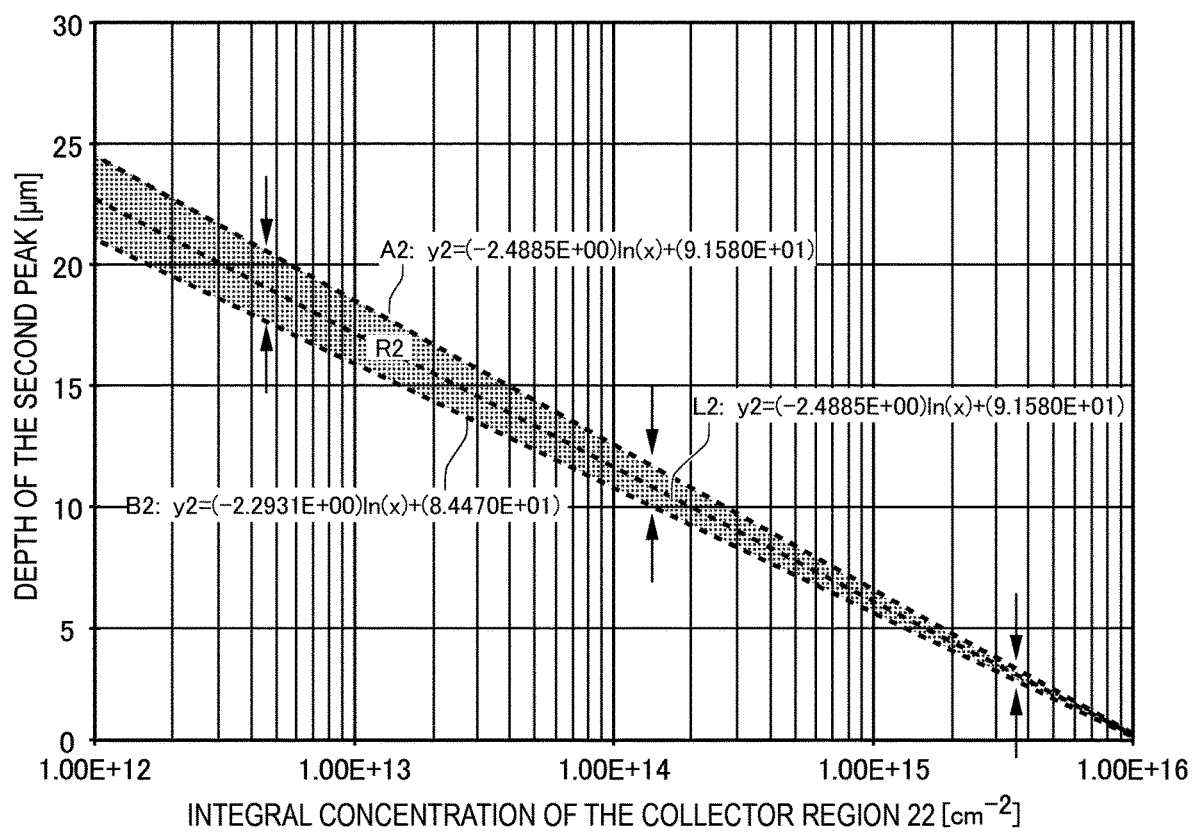
FIG. 7C shows another example of a relation between the integral concentration of the collector region 22 and the depth of the second peak P2.

FIG. 7C shows another example of a relation between the integral concentration of the collector region 22 and the depth of the second peak P2. The region R2 of the present example indicates a region corresponding to ±5% of the base line L2.

The base line L2 is identical to the base line L2 in FIG. 7A. The line A2 and the line B2 of the present example are represented by the following equation.

Line $A2: y2=(-2.4885E+00)\ln(x)+(9.1580E+01)$

Line $B2: y2=(-2.2931E+00)\ln(x)+(8.4470E+01)$

Similarly, in this case, the depth of the second peak P2 and the integral concentration of the collector region 22 may be set to belong to the region R2.

Moreover, also for FIG. 7A to FIG. 7C, the range of an integral concentration of the collector region 22 may be restricted similarly to FIG. 6A to FIG. 6F. For example, in FIG. 7A to FIG. 7C, the region R2 may be a region with the integral concentration of the collector region 22 of 1.00E14 cm$^{-2}$ or less, a region with that of the 5.00E13 cm$^{-2}$ or less, a region with that of 3.00E13 cm$^{-2}$ or less, or a region with that of 1.00E13 cm$^{-2}$ or less.

Figure 8A:
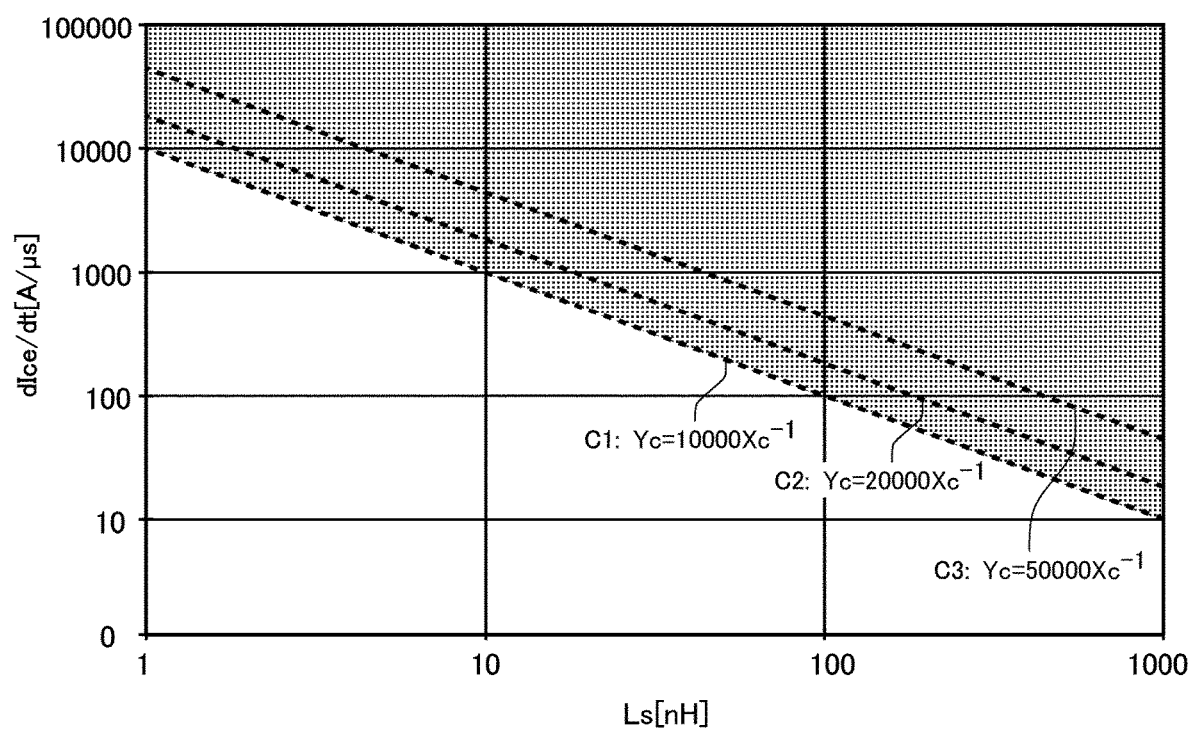
FIG. 8A is a diagram for describing a relation between float inductance Ls and collector current decrease rate dIce/dt.

FIG. 8A is a diagram for describing a relation between a float inductance Ls and a collector current decrease rate dIce/dt. The float inductance Ls is set to be Xc [nH], and the collector current decrease rate dIce/dt is set to be Yc [A/μs]. The line C1 is represented by the following equation.

Line $C1: Yc=10000Xc^{-1}$

The float inductance Ls and the collector current decrease rate dIce/dt is set to the range that is greater than the line C1. The range that is greater than the line C1 refers to a region that is located above the line C1 in the graph indicating a relation between the float inductance Ls and the collector current decrease rate dIce/dt. The range that is greater than the line C1 is a region filled in with a pattern.

The float inductance Ls and the collector current decrease rate dIce/dt may be set to the range that is greater than the line C2. The line C2 is represented by the following equation.

Line $C2: Yc=20000Xc^{-1}$

The float inductance Ls and the collector current decrease rate dIce/dt may be set to the range that is greater than the line C3. The line C3 is represented by the following equation.

Line $C3: Yc=50000Xc^{-1}$

Here, the greater the float inductance Ls becomes, the easier it becomes to maintain a current, thereby a voltage overshoot increases when shutting down a current. Also, the greater the collector current decrease rate dIce/dt is, the greater the voltage overshoot becomes when shutting down the current. Therefore, if the float inductance Ls and the collector current decrease rate dIce/dt are set to be in the range that is greater than any one of the line C1 to the line C3, the voltage overshoot tends to snap off. The semiconductor device 100 of the present example can prevent instant destruction even if the float inductance Ls and the collector current decrease rate dIce/dt are set to be in the range that is greater than any one of the line C1 to the line C3, the voltage overshoot tends to snap off.

Figure 8B:
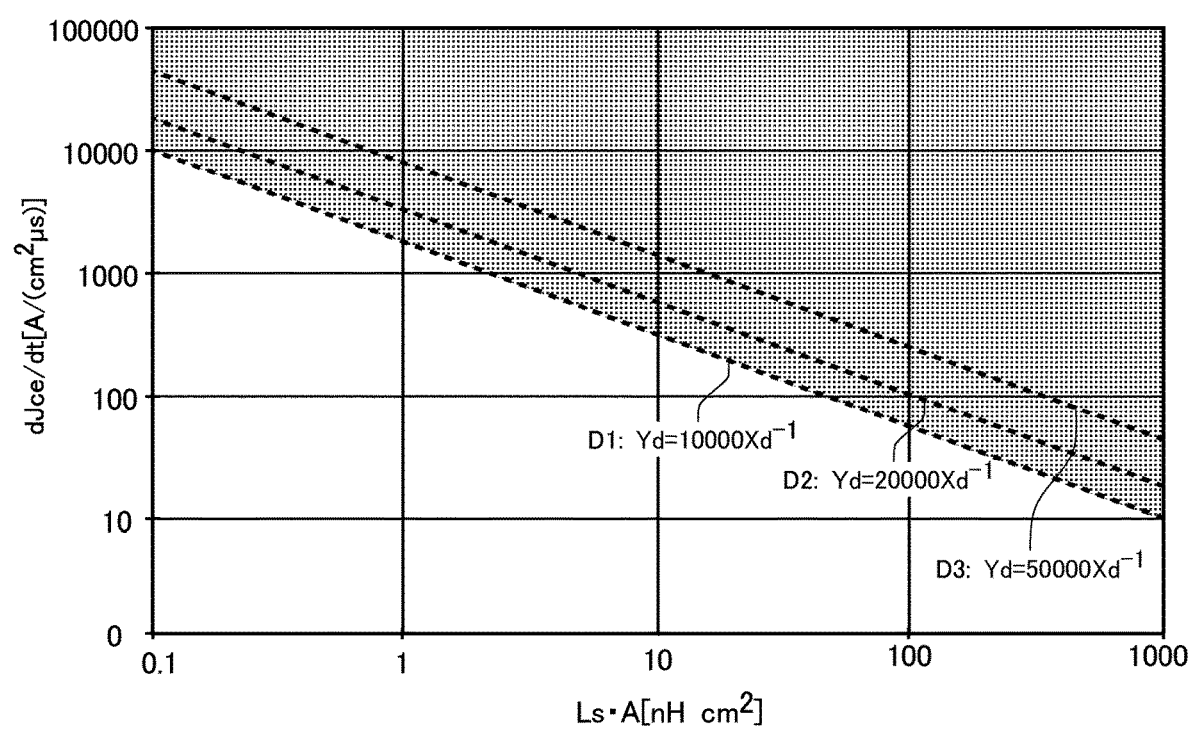
FIG. 8B is a diagram for describing a relation between comparative stray inductance Ls·A and current density dJce/dt.

FIG. 8B is a diagram for describing a relation between comparative stray inductance Ls·A and current density dJce/dt. The comparative stray inductance Ls·A is set to be Xd [nH cm$^2$], and the current density dJce/dt is set to be Yd [A/(cm$^2$ μs)].

The comparative stray inductance Ls·A is a specific value that results from multiplying the float inductance Ls by the area A of the active region 110 (cm$^2$). The current density dJce/dt is a value that results from dividing the collector current decrease rate dIce/dt by the area A of the active region 110 (cm$^2$).

The comparative stray inductance Ls·A and the current density dJce/dt is set to the range that is greater than the line D1. The line D1 is represented by the following equation.

Line D1: $Yd=10000Xd^{-1}$

The comparative stray inductance Ls·A and the current density dJce/dt may be set to the range that is greater than the line D2. The line D2 is represented by the following equation.

Line D2: $Yd=20000Xd^{-1}$

The comparative stray inductance Ls·A and the current density dJce/dt may be set to the range that is greater than the line D3. The line D3 is represented by the following equation.

Line D3: $Yd=50000Xd^{-1}$

Here, the greater the comparative stray inductance Ls·A or the current density dJce/dt are, the greater the voltage overshoot becomes when shutting down a current. Therefore, if the comparative stray inductance Ls·A or the current density dJce/dt are set to be in the range that is any one or above of the line D1 to the line D3, the voltage overshoot tends to snap off. The semiconductor device 100 of the present example can prevent instant destruction even if the comparative stray inductance Ls·A or the current density dJce/dt are set to be in the range that is greater than any one of the line D1 to the line D3, the voltage overshoot tends to snap off.

Figure 9:
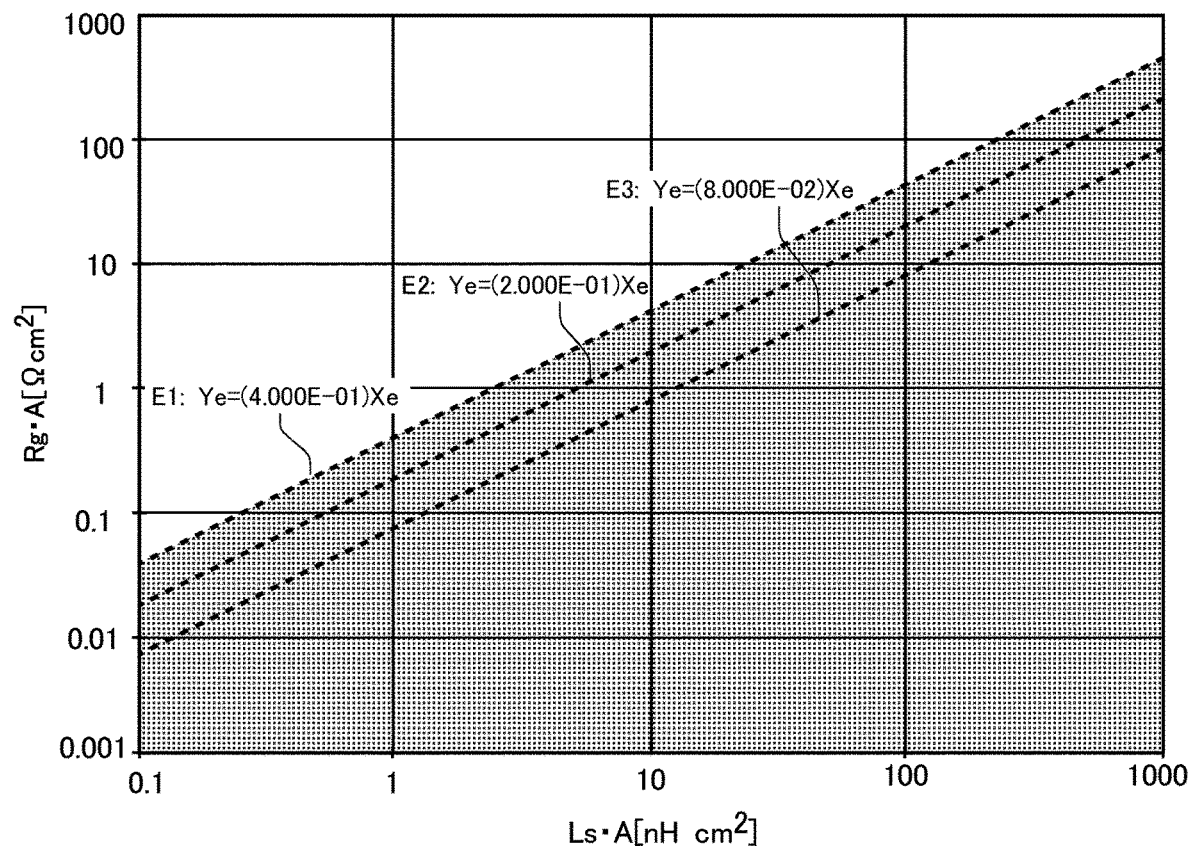
FIG. 9 is a diagram for describing a relation between comparative stray inductance Ls·A and comparative gate resistance Rg·A.

FIG. 9 is a diagram for describing a relation between the comparative stray inductance Ls·A and the comparative gate resistance Rg·A. The comparative stray inductance Ls·A is set to be Xe [nH cm$^2$], the comparative gate resistance Rg·A is set to be Ye [Ωcm$^2$]. The comparative gate resistance Rg·A is a specific value that results from multiplying the gate resistance Rg of a driving circuit of the semiconductor device 100 by the area A of the active region 110 (cm$^2$).

The collector current decrease rate dIce/dt is changed by the gate resistance Rg of a driving circuit of the semiconductor device 100, in addition to the float inductance Ls. If the gate resistance Rg decreases, the collector current decrease rate dIce/dt tends to increase.

The comparative stray inductance Ls·A and the comparative gate resistance Rg·A may be set to be the range of the line E1 or less. The line E1 is represented by the following equation.

Line E1: $Ye=(4.000E-01)Xe$

The comparative stray inductance Ls·A and the comparative gate resistance Rg·A may be set to be the range of the line E2 or less. The line E2 is represented by the following equation.

Line E2: $Ye=(2.000E-01)Xe$

The comparative stray inductance Ls·A and the comparative gate resistance Rg·A may be set to be the range of the line E3 or less. The line E3 is represented by the following equation.

Line E3: $Ye=(8.000E-02)Xe$

Here, the smaller the comparative gate resistance Rg·A is, the greater the voltage overshoot becomes when shutting down a current. Therefore, if the comparative stray inductance Ls·A and the comparative gate resistance Rg·A are set to be in the range that is any one of or below the line E1 to the line E3, the voltage overshoot tends to snap off. The semiconductor device 100 of the present example can prevent instant destruction even if the comparative stray inductance Ls·A and the comparative gate resistance Rg·A are set to be in the range that is any one of or below the line E1 to the line E3.

While the embodiments of the present invention have been described, the technical scope of the present invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . Semiconductor substrate, 12 . . . Emitter region, 14 . . . Base region, 15 . . . Contact region, 16 . . . Accumulation region, 17 . . . Well region, 18 . . . Drift region, 20 . . . Field stop region, 21 . . . Front surface, 22 . . . Collector region, 23 . . . Back surface, 24 . . . Collector electrode, 25 . . . Connection portion, 30 . . . Dummy trench portion, 31 . . . Extending portion, 32 . . . Dummy dielectric film, 33 . . . Connection section, 34 . . . Dummy conductive portion, 38 . . . Interlayer dielectric film, 39 . . . Oxide film, 40 . . . Gate trench portion, 41 . . . Extending portion, 42 . . . Gate dielectric film, 43 . . . Connection section, 44 . . . Gate conductive portion, 50 . . . Gate metal layer, 51 . . . Gate runner, 52 . . . Emitter electrode, 54 . . . Contact hole, 55 . . . Contact hole, 56 . . . Contact hole, 60 . . . Dummy trench region, 61 . . . Mesa portion, 65 . . . Well-contact region, 70 . . . Transistor portion, 71 . . . Mesa portion, 76 . . . Temperature sensing portion, 80 . . . Diode portion, 81 . . . Mesa portion, 82 . . . Cathode region, 90 . . . Boundary portion, 91 . . . Mesa portion, 92 . . . Guard ring portion, 94 . . . Electrode layer, 96 . . . Channel stopper region, 100 . . . Semiconductor device, 110 . . . Active region, 120 . . . Outer peripheral region, 130 . . . Pad region, 131 . . . Gate pad, 132 . . . Sense-IGBT, 133 . . . Sense-emitter pad, 134 . . . Anode pad, 135 . . . Cathode pad, 500 . . . Semiconductor device

What is claimed is:

1. A semiconductor device comprising:
   a drift region of a first conductivity type provided on a semiconductor substrate;
   a field stop region of a first conductivity type provided below the drift region and having one or more peaks of a doping concentration in a depth direction; and
   a collector region of a second conductivity type provided below the field stop region,
   wherein when an integral in the depth direction of a dopant concentration of the collector region is set to be x [cm$^{-2}$], a depth of a first peak of the one or more peaks of the doping concentration of the field stop region that is a shallowest from a back surface of the semiconductor substrate is set to be y1 [μm], line $A1: y1[\mu m] = (-7.4699E-01)\ln(x\ [cm^{-2}]) + (2.7810E+01)$, and line $B1: y1[\mu m] = (-4.7772E-01)\ln(x\ [cm^{-2}]) + (1.7960E+01)$, the depth of the first peak [μm] and the integral in the depth direction of the dopant concentration [cm$^{-2}$] of the collector region are within a range between the line A1 [μm/cm$^{-2}$] and the line B1 [μm/cm$^{-2}$], and the collector region includes a peak of the dopant concentration in the depth direction that is higher than a doping concentration of the first peak in the field stop region.

2. The semiconductor device according to claim 1, wherein
the integral of concentration of the collector region is 8.00E15 cm$^{-2}$ or less.

3. The semiconductor device according to claim 1, wherein
the integral of concentration of the collector region is 3.00E14 cm$^{-2}$ or less.

4. The semiconductor device according to claim 1, wherein
the integral of concentration of the collector region is 2.00E14 cm$^{-2}$ or less.

5. The semiconductor device according to claim 1, wherein
the integral of concentration of the collector region is 1.00E14 cm$^{-2}$ or less.

6. The semiconductor device according to claim 1, wherein
the integral of concentration of the collector region is 5.00E13 cm$^{-2}$ or less.

7. The semiconductor device according to claim 1, wherein
the integral of concentration of the collector region is 3.00E13 cm$^{-2}$ or less.

8. The semiconductor device according to claim 1, wherein
the integral of concentration of the collector region is 1.00E13 cm$^{-2}$ or less.

9. The semiconductor device according to claim 1, wherein
a depth of the first peak is 0.5 μm or more and 7.2 μm or less.

10. The semiconductor device according to claim 1, wherein
a depth of the first peak is 2.0 μm or more and 7.2 μm or less.

11. The semiconductor device according to claim 1, wherein
a depth of a second peak of the one or more peaks of the doping concentration that is a second shallowest from the back surface is set to be y2 [μm], line $A2: y2[\mu m] = (-3.1095E+00)\ln(x[cm^{-2}]) + (1.1416E+02)$, and line $B2: y2[\mu m] = (-1.9239E+00)\ln(x[cm^{-2}]) + (7.1030E+01)$, a depth of the second peak and the integral of concentration are within a range between the line A2 and the line B2.

12. The semiconductor device according to claim 11, wherein
a depth of the second peak is 3.5 μm or more and 28 μm or less.

13. The semiconductor device according to claim 1, wherein
a dopant of the one or more peaks of the doping concentration is hydrogen.

14. The semiconductor device according to claim 1, further comprising:
an active region provided on the semiconductor substrate; and
an outer peripheral region provided in an outer periphery of the active region in a top view of the semiconductor substrate.

15. The semiconductor device according to claim 1, further comprising:
a base region of the second conductivity type provided above the drift region;
an emitter region of the first conductivity type provided above the base region and whose doping concentration is higher than that of the drift region;
a contact region of the second conductivity type provided above the base region and whose doping concentration is higher than that of the base region; and
a plurality of gate trench portions provided on the semiconductor substrate.

16. The semiconductor device according to claim 1, wherein
a doping concentration in a boundary between the field stop region and the collector region is 1E16 cm$^{-3}$ or less.

17. The semiconductor device according to claim 1, wherein
a doping concentration in a boundary between the field stop region and the collector region is 5E15 cm-3 or less.

18. The semiconductor device according to claim 1, wherein
a doping concentration in a boundary between the field stop region and the collector region is 2E15 cm$^{-3}$ or less.

19. The semiconductor device according to claim 1, wherein
a hydrogen chemical concentration in a boundary between the field stop region and the collector region is 1E18 cm$^{-3}$ or less.

20. The semiconductor device according to claim 1, wherein
a hydrogen chemical concentration in a boundary between the field stop region and the collector region is 1E17 cm$^{-3}$ or less.

21. The semiconductor device according to claim 1, wherein
a hydrogen chemical concentration in a boundary between the field stop region and the collector region is 1E15 cm$^{-3}$ or more.

22. The semiconductor device according to claim 1, wherein
a hydrogen chemical concentration in a boundary between the field stop region and the collector region is 1E16 cm$^{-3}$ or more.

23. The semiconductor device according to claim 1, wherein
a dopant of the first peak is phosphorous.

24. The semiconductor device according to claim 1, wherein a dopant of peaks of the doping concentration other than the first peak out of the one or more peaks is hydrogen.

25. The semiconductor device according to claim 1, wherein
a front surface side region of the semiconductor substrate does not comprise a lifetime killer region.

26. A system comprising the semiconductor device according to claim 1, wherein the semiconductor device is coupled to a circuit having
a stray inductance Ls set to be Xc [nH], and a collector current decrease rate dice/dt set to be Yc [A/µs], and line $C1: Yc = 10000 Xc^{-1}$, the stray inductance Ls and the collector current decrease rate dice/dt are within a range that is greater than the line C1.

* * * * *